(12) United States Patent
Kim et al.

(10) Patent No.: US 8,664,064 B2
(45) Date of Patent: Mar. 4, 2014

(54) FIN FIELD EFFECT TRANSISTOR AND METHOD FOR FORMING THE SAME

(75) Inventors: Keunnam Kim, Gyounggi-Do (KR); Makoto Yoshida, Gyounggi-Do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 26 days.

(21) Appl. No.: 12/926,471

(22) Filed: Nov. 19, 2010

(65) Prior Publication Data
US 2011/0092039 A1    Apr. 21, 2011

Related U.S. Application Data

(62) Division of application No. 11/714,160, filed on Mar. 6, 2007, now Pat. No. 7,863,683.

(30) Foreign Application Priority Data

May 13, 2006  (KR) .................. 10-2006-0043169

(51) Int. Cl.
    *H01L 21/336* (2006.01)
(52) U.S. Cl.
    USPC ........... 438/270; 438/589; 438/197; 438/238; 257/E21.41; 257/331; 257/296
(58) Field of Classification Search
    USPC ............ 438/270, 589, 197, 238; 257/E21.41, 257/331, 296
    See application file for complete search history.

(56) References Cited

U.S. PATENT DOCUMENTS

| 2003/0085424 | A1  | 5/2003  | Bryant et al. |
| 2005/0032322 | A1* | 2/2005  | Kim et al. ............... 438/301 |
| 2005/0112817 | A1* | 5/2005  | Cheng et al. ............ 438/219 |
| 2005/0173753 | A1* | 8/2005  | Kim et al. ............... 257/315 |
| 2006/0113522 | A1* | 6/2006  | Lee et al. ................ 257/18 |
| 2006/0121675 | A1* | 6/2006  | Kim et al. ............... 438/264 |
| 2006/0244066 | A1* | 11/2006 | Yeo et al. ............... 257/347 |
| 2007/0012997 | A1* | 1/2007  | Chung et al. ............ 257/331 |
| 2007/0020902 | A1* | 1/2007  | Chung et al. ............ 438/589 |
| 2007/0045725 | A1* | 3/2007  | Yun et al. ............... 257/330 |
| 2007/0138523 | A1  | 6/2007  | Popp et al. |
| 2007/0197042 | A1* | 8/2007  | Brask ...................... 438/753 |
| 2010/0044784 | A1* | 2/2010  | Oh et al. ................. 257/329 |

OTHER PUBLICATIONS

U.S. Office Action dated Apr. 30, 2008.
U.S. Office Action dated Jan. 7, 2009.
U.S. Office Action dated Mar. 24, 2009.
U.S. Office Action dated Oct. 20, 2009.

* cited by examiner

*Primary Examiner* — Cathy N Lam
(74) *Attorney, Agent, or Firm* — Harness, Dickey & Pierce, P.L.C.

(57) ABSTRACT

Example embodiments are directed to a method of forming a field effect transistor (FET) and a field effect transistor (FET) including a source/drain pair that is elevated with respect to the corresponding gate structure.

18 Claims, 26 Drawing Sheets

I ↔ I'

FIN FIELD EFFECT TRANSISTOR AND METHOD FOR FORMING THE SAME

PRIORITY STATEMENT

This application is a divisional of application Ser. No. 11/714,160 filed Mar. 6, 2007 now U.S. Pat. No. 7,863,683, which claims priority under 35 USC §119 to Korean Patent Application No. 10-2006-43169 filed on May 13, 2006, the contents of each of which are herein incorporated by reference in their entirety for all purposes.

BACKGROUND

1. Field

Example embodiments relate to field effect transistors (FETs), for example, to FETs and methods for manufacturing FETs.

2. Description of the Related Art

As the integration density of integrated circuit field effect transistors (FETs) continues to increase, the size of the active region and the channel length may continue to decrease. With the reduction in the channel length of the transistor, the influence of the source and/or drain upon the electric field or potential in the channel region may increase. This is called the "short channel effect". Further, scaling down the active size may include decreasing the channel width, which may increase a threshold voltage. This is called the "narrow width effect".

Various structures have been developed to improve or maximize the device performance, while reducing the sizes of elements formed on a substrate. For example, a fin FET (FinFET) transistor has been proposed and is in use today for memory devices. However, conventional FinFETs may also have problems. FinFETs may have a higher off current, because of a shorter distance (effective length) between source and drain. Also, FinFETs may have a stronger GIDL (Gate-Induced Leakage) problem.

FIG. 1 illustrates a relationship between a conventional gate structure 26 and a conventional source/drain 30. As shown in FIG. 1, the gate structure 26 may be formed between the source/drain 30. As the size of the transistor of FIG. 1 is reduced, the effective length (EL) between the source and drain is reduced, therefore the GIDL and/or off current may be increased.

SUMMARY

Example embodiments provide an elevated source/drain (S/D) structure. An elevated S/D structure may extend the effective length between the source and drain, therefore the GIDL and/or off current may be decreased.

Example embodiments are directed to a field effect transistor (FET), including a substrate, an active fin formed from the substrate, the active fin including at least one source and drain pair, and a recessed region in a center area between each of the at least one source and drain pairs, and at least one gate structure, substantially perpendicular to the active fin and overlapping the active fin in the center area between each of the at least one source and drain pairs, the at least one gate structure including a gate electrode and a gate spacer, both formed in the recessed region in the center area between each of the at least one source and drain pairs of the active fin.

In example embodiments, the FET may further include an isolation layer adjacent the active fin, wherein an upper surface of the active fin is higher than an upper surface of the isolation layer and each recessed portion is higher than the upper surface of the isolation layer.

In example embodiments, the FET may further include an isolation layer adjacent the active fin, wherein an upper surface of the active fin is substantially planar with an upper surface of the isolation layer and a first portion of the upper surface of the isolation layer is substantially planar with an upper surface of the active fin and a second portion of the upper surface of the isolation layer adjacent to the active fin is lower than the upper surface of the active fin.

In example embodiments, the at least one gate structure may further include a gate mask.

In example embodiments, the FET may further include a gate insulation layer on the active fin.

In example embodiments, the FET may further include an oxide layer between the substrate and the active fin and the isolation layer and a nitride layer between the oxide layer and the isolation layer.

In example embodiments, a bottom surface of the recessed region may have a semicircular shape.

In example embodiments, the FET may further include an etch stop layer formed on the at least one gate structure and an interlayer dielectric formed on the etch stop layer, wherein the interlayer dielectric includes at least one contact hole, and wherein the at least one contact hole is filled with conductive material to form a contact node.

In example embodiments, the gate spacer may be as wide as the active fin.

In example embodiments, the recessed region may increase a surface area overlap between the at least one gate structure and the active fin.

In example embodiments, a DRAM may include a plurality of FETs, as described above.

Example embodiments are directed to a method of forming an FET including providing a substrate, forming an active fin including a source and drain, respectively, on the substrate and an isolation region adjacent to the active fin, forming a recessed region in a center area of the active fin, and forming a gate structure including a gate electrode and a gate spacer, substantially perpendicular to the active fin, in the recessed region in the center area of the active fin.

In example embodiments, an upper surface of the active fin may be higher than an upper surface of the isolation layer and each recessed region may be higher than the upper surface of the isolation layer.

In example embodiments, an upper surface of the active fin may be substantially planar with an upper surface of the isolation layer, a first portion of the upper surface of the isolation layer may be substantially planar with an upper surface of the active fin and a second portion of the upper surface of the isolation layer adjacent to the active fin may be lower than the upper surface of the active fin.

In example embodiments, the active fin and the isolation region may be formed by shallow trench isolation (STI).

In example embodiments, forming the active fin may further include forming a pad oxide on the substrate, forming a hard mask layer on the pad oxide by chemical vapor deposition (CVD), forming an isolation layer in the isolation region, forming a trench in the center area of the active fin.

In example embodiments, forming the recessed region in the center area of the active fin may further include rounding a bottom surface of the trench by a wet etch process and etching away at least one of the pad oxide, the hard mask layer, and a portion of the isolation layer.

In example embodiments, forming the gate structure may further include forming a gate insulating layer on the active fin, forming a gate electrode layer on the gate insulating layer, forming a gate mask layer on the gate electrode layer, depositing a photoresist on the gate mask layer, patterning the photoresist to form a gate electrode and a gate mask on a bottom surface of the recessed region, depositing a gate spacer layer on the gate insulating layer in the recessed region and the gate mask, and patterning the gate spacer layer to form the gate spacer in the recessed region on sidewalls of the gate electrode and the gate mask in the recessed region to form the gate structure, wherein the gate spacer is as wide as the active fin.

In example embodiments, the gate electrode and the gate mask may be formed by a CVD, photoresist and etch process.

In example embodiments, the gate insulating layer may include at least one of an oxide layer, a nitride layer, and a metal oxide layer.

In example embodiments, the gate spacer may be formed by a CVD, photoresist and etch process.

In example embodiments, the source and drain of the active fin may be formed by a self-aligned ion implantation process using the gate structure.

Example embodiments are directed to a method of forming an FET including providing a substrate, depositing a pad oxide on the substrate, depositing a hard mask layer on the pad oxide by chemical vapor deposition, forming an active fin and isolation layer by shallow trench isolation, forming a first trench in a center area of the active fin, rounding a bottom surface of the first trench to form a recessed region in the active fin, depositing a gate insulating layer on at least an upper surface of the active fin, forming a gate structure on the bottom surface of the recessed region, forming a gate spacer on sidewalls of the gate structure in the recessed region, forming a source and drain, at an upper portion of the active fin, elevated with respect to the gate structure.

In example embodiments, an upper surface of the active fin may be higher than an upper surface of the isolation layer and the recessed region may be higher than the upper surface of the isolation layer.

In example embodiments, the method may further include removing an upper portion of the isolation layer adjacent to the active fin, such that an upper surface of the active fin is substantially planar with an upper surface of the isolation layer and a first portion of the upper surface of the isolation layer is substantially planar with an upper surface of the active fin and a second portion of the upper surface of the isolation layer adjacent to the active fin is lower than the upper surface of the active fin.

BRIEF DESCRIPTION OF THE DRAWINGS

The above and other features and advantages of example embodiments will become more apparent by describing them in detailed with reference to the accompanying drawings.

DETAILED DESCRIPTION

Figure 1:
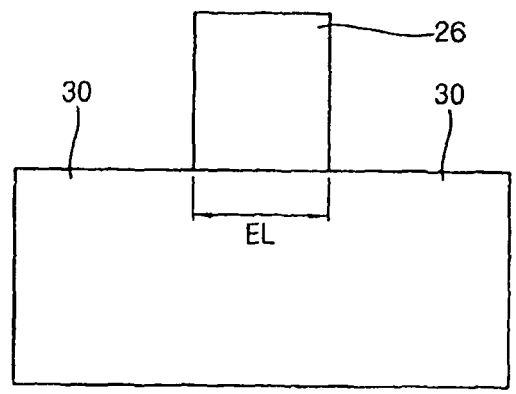
FIG. 1 illustrates a relationship between a conventional gate structure and a conventional source/drain pair.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these figures but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claims.

Figure 2A:
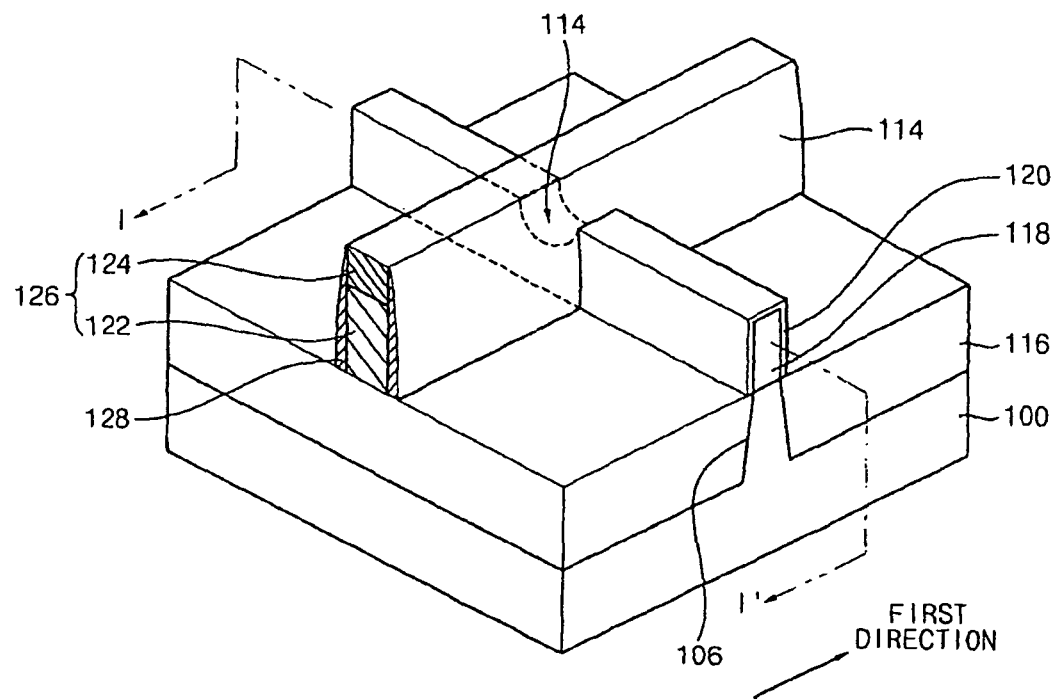
FIG. 2A illustrates a field effect transistor (FET) in accordance with example embodiments.

FIG. 2A illustrates a field effect transistor (FET) in accordance with example embodiments. As illustrated in FIG. 2a, the FET may include a substrate 100, a first trench 106, a second trench 114, an isolation layer 116, an active fin 118, a gate insulating layer 120, a gate structure 126, and/or a spacer 128. The gate structure 126a may include a gate electrode 122 and/or a gate mask 124.

An elevated source/drain FinFET structure may be formed on the active fin 118 and the isolation layer 116. The active fin 118 may be formed on a substrate 100. The isolation layer 116 may be formed in a first trench 106 on both sides of the active fin 118. The active fin 118 height may be higher than the isolation layer 116 height, therefore, both sides of the active fin 118 may be exposed. The active fin 118 may have a curved or rounded trench surface in a center area thereof. The gate structure 126 may be formed on the curved or rounded second trench 114 and the isolation layer 116, to look, for example, like a saddle. The curved or rounded surface of the second trench 114 may provide a longer effective length between the source and drain, therefore the GIDL and/or off current may be decreased.

Figure 2B:
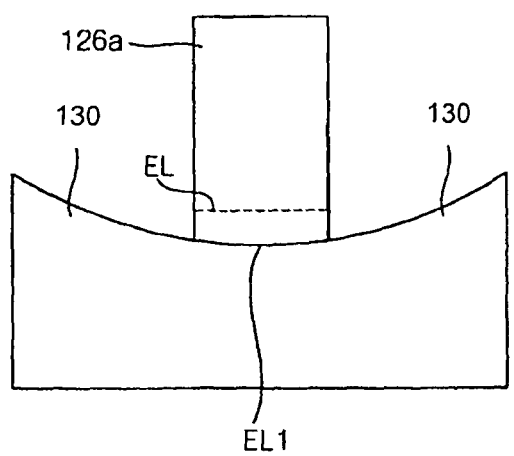
FIGS. 2B-2D illustrate example relationships between a gate structure and a elevated source/drain in accordance with example embodiments.
Figure 2C:
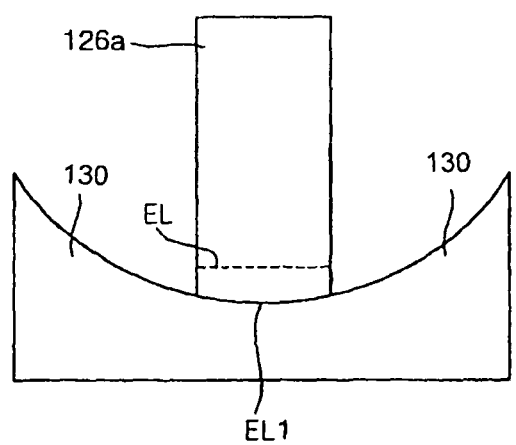
Figure 2D:
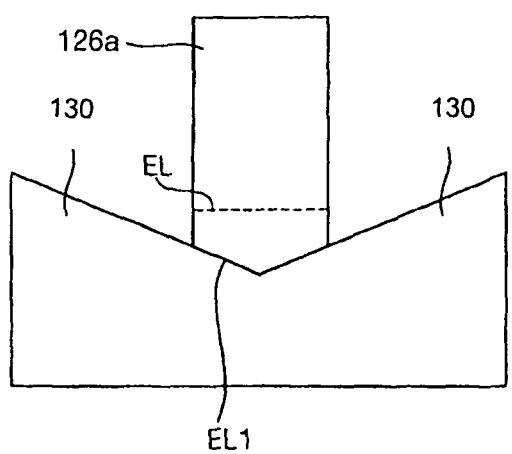

FIGS. 2B-2D illustrate example relationships between the gate structure 126a and the elevated source/drain 130 along line I-I', in more detail. As shown in FIGS. 2B-2D, elevating the source and drain 130 with respect to the gate structure 126a results in an effective length $EL_1$, which is longer than the conventional effective length EL. Because $EL_1$ is longer than EL, the GIDL and/or off current may be decreased. FIGS. 2B-2D illustrate example relationships between the gate structure 126a and the elevated source/drain 130, however, the surface of the second trench 114 may take any shape or contour which results in an effective length $EL_1$, which is longer than the conventional effective length EL.

Figure 2E:
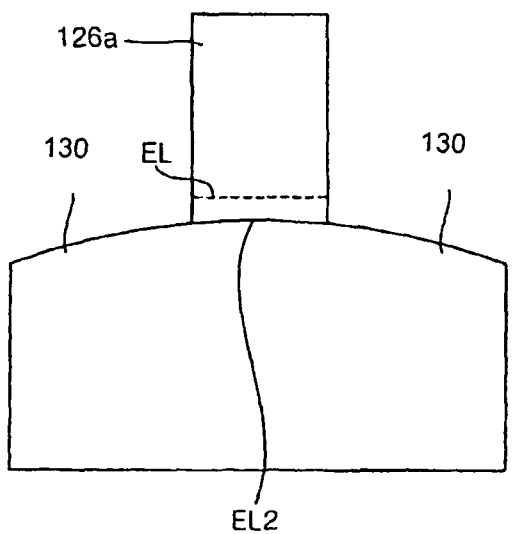
FIG. 2E illustrates an example relationship between a gate structure and a depressed source/drain in accordance with example embodiments.

FIG. 2E illustrates a variant of a relationship between the gate structure 126a and the elevated source/drain 130 along line I-I', where the source/drain 130 is further depressed, rather than elevated. As shown in FIG. 2E, further depressing the source and drain 130 with respect to the gate structure 126a also results in an effective length $EL_2$, which is longer than the conventional effective length EL. Because $EL_2$ is longer than EL, the GIDL and/or off current may be decreased. FIG. 2E illustrates an example relationship between the gate structure 126a and the depressed source/drain 130, however, the surface of the second trench 114 may take any shape or contour which results in an effective length $EL_2$, which is longer than the conventional effective length EL.

FIGS. 3-8 illustrate an example method of manufacturing the example FinFET of FIG. 2A, along line I-I'.

Figure 3:
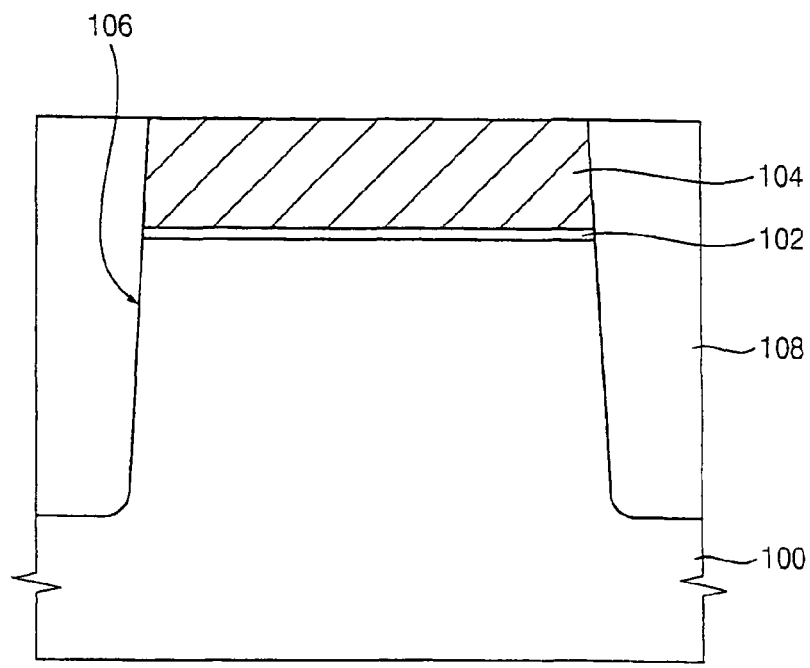
FIGS. 3-8 illustrate an example method of manufacturing the example FinFET of FIG. 1.

As illustrated in FIG. 3, the first trench 106 may form an active region and isolation regions. A pad oxide 102 may be formed on the active region (as shown in FIG. 2, the raised portion of the substrate 100 will later define the active fin 118). The pad oxide 102 may be on the order of about 10-15 nm thick and may be is used to protect the substrate 100 from damage by subsequent etching processes. A first hard mask layer 104 may be formed on the pad oxide 102, for example, by a chemical vapor deposition (CVD) process. An isolation layer 108 may be formed in the isolation regions of the substrate 100, for example, by a shallow trench isolation (STI) process.

Chemical vapor deposition (CVD) is a chemical process used to produce high-purity, high-performance solid materials. In a typical CVD process, a substrate such as a semiconductor wafer, is exposed to one or more volatile precursor compounds within a reaction chamber under a combination of pressure and radio frequency (RF) power sufficient to induce reaction and/or deposition of the precursor compounds on the substrate surface to produce the desired deposition layer. Parameters controlled during a CVD process may include, for example, pressure, RF power, substrate bias, substrate temperature and precursor compound feed rates. Unreacted precursor compounds and/or volatile byproducts are typically removed from the reaction chamber by a flow of carrier gas and/or pumping.

CVD processes may be broadly classified according to their operating pressure and include, for example, atmospheric pressure CVD (APCVD), low-pressure CVD (LPCVD), or ultrahigh vacuum CVD (UHVCVD) (a term generally applies to processes at pressures, typically below about $10^{-6}$ Pa (~$10^{-8}$ torr), or by certain other characteristics including, for example, aerosol assisted CVD (AACVD), direct liquid injection CVD (DLICVD), microwave plasma-assisted CVD (MPCVD), plasma-enhanced CVD (PECVD), remote plasma-enhanced CVD (RPECVD), atomic layer CVD (ALCVD), hot wire CVD (HWCVD) (also known as catalytic CVD (Cat-CVD) or hot filament CVD (HFCVD), metalorganic chemical vapor deposition (MOCVD), rapid thermal CVD (RTCVD) and vapor phase epitaxy (VPE).

Silicon, for example, may be deposited using CVD processes that utilize the decomposition of silane ($SiH_4$), using a silane feedstock that may include nitrogen or other carrier gas(es). The silicon may also be doped by including an additional precursor compound, for example, phosphine, arsine and/or diborane during the deposition may be to the CVD chamber. Diborane increases the growth rate, but arsine and phosphine decrease growth rate.

Silicon dioxide is also commonly deposited using CVD processes using as feed gases a combination of silane, oxygen, dichlorosilane ($SiCl2H2$), nitrous oxide ($N2O$), and/or tetraethylorthosilicate (TEOS; $Si(OC_2H_5)_4$). The choice of source gas(es) may be influenced by the thermal stability of the material(s) already present on the substrate. For example, silane can be used for forming oxide deposits between about 300 and 500° C., dichlorosilane at around 900° C., and TEOS between about 650 and 750° C. The choice of source gas(es) may also be influenced by the device requirements in that silane-based oxide depositions tend to exhibit reduced dielectric strength and tend to be less conformal than those achieved with dichlorosilane and/or TEOS. Like silicon, additional atomic species may be introduced into the silicon oxide during deposition to provide for alloyed and/or doped material layers including, for example, silicon dioxide alloyed with phosphorus pentoxide (P-glass) to permit reflow processing at temperatures above about 1,000° C.

Although some metals, for example, aluminum and copper, are rarely deposited using a CVD process, other metals, particularly the refractory metals are commonly deposited using CVD processes including, for example, molybdenum, tantalum, titanium and tungsten and their oxides and nitrides.

While conventional device isolation technology for electrically isolating individual devices or active regions on which such devices will be formed during fabrication of semiconductor devices utilized local oxidation of silicon (LOCOS) method, increasingly demanding design rules have led to the widespread adoption of shallow trench isolation (STI) methods.

STI methods form device isolation regions by etching a pattern of shallow trenches into a substrate and then filling these trenches with one or more suitable dielectric materials, for example, silicon oxide. A typical STI method includes forming a hard pattern on the substrate, for example, the combination of a pad oxide layer and a nitride layer. This hard pattern is then used as an etch mask for removing a portion of the exposed substrate to form a trench pattern. An insulating material may then be applied to the etched substrate to fill the trench pattern and the resulting structure may be subjected to chemical mechanical polishing (CMP) and/or etchback processes to expose the active regions under the hard mask and provide a planar surface suitable for subsequent processing. An optional capping layer may also be applied to the primary insulating material.

The insulating material(s) may be applied using a variety of techniques including, for example, chemical vapor deposition (CVD) and/or spin-on-glass (SOG) methods and may include materials such as high density plasma CVD (HDP-CVD) oxides, undoped silicate glasses (USG), doped silicate glasses (PSG, BSG, BPSG) and/or tetraethylorthosilicate (TEOS) oxides.

Figure 4:
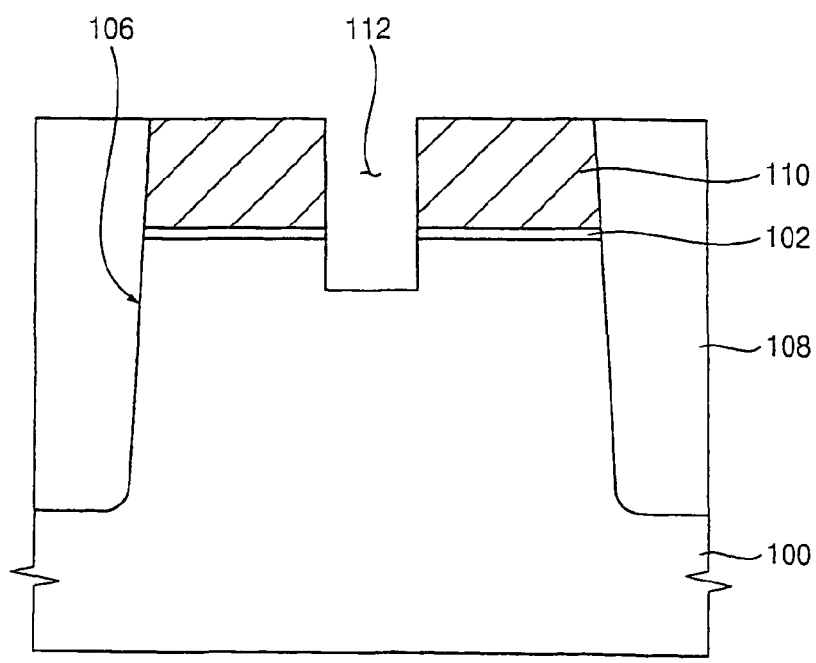

As illustrated in FIG. 4, a second trench 112 may be formed in the active region, for example, in a center area of the active region by, for example, a photo and etch process. Also, the first hard mask layer 104 may be converted to a second hard mask layer 110.

Figure 5:
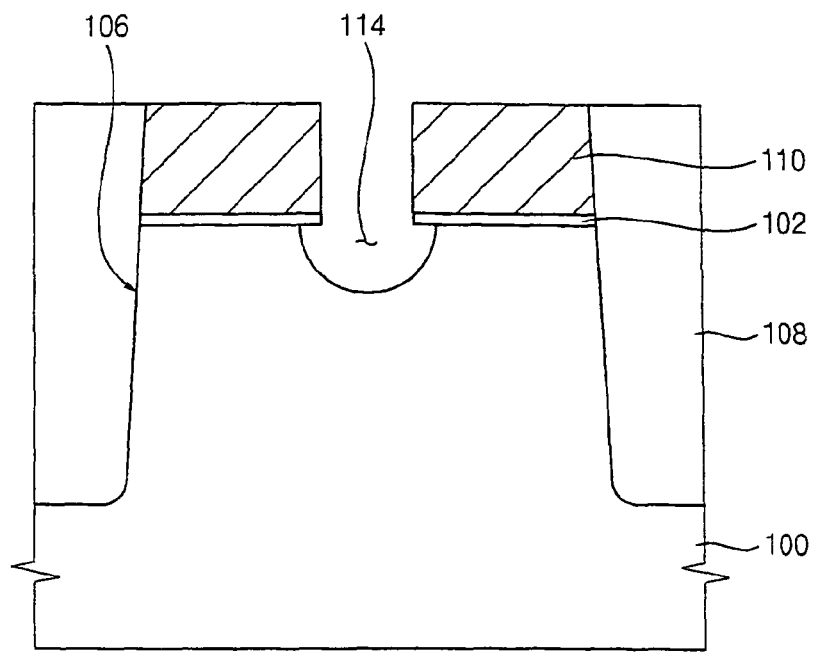

As illustrated in FIG. 5, a bottom portion of the second trench 112a may be curved or rounded by a wet etching process to form curved or rounded trench 114.

Figure 6:
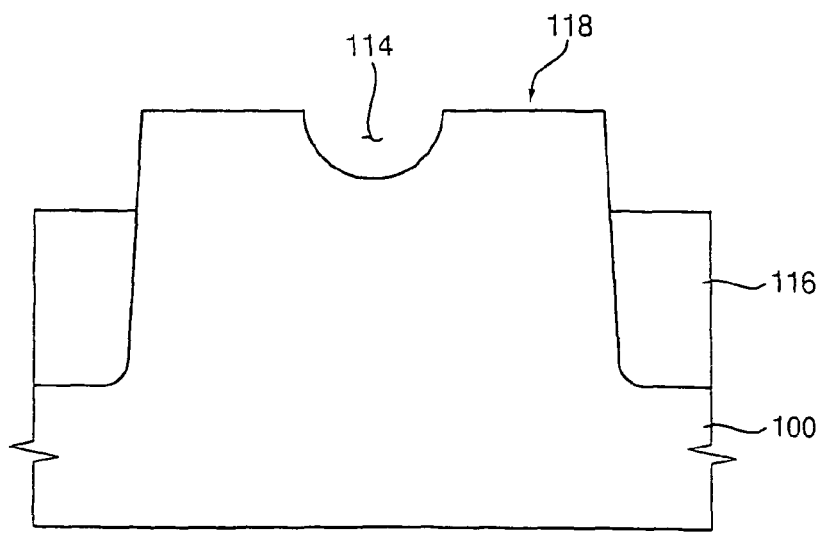

As illustrated in FIG. 6, the pad oxide 102 and the second hard mask layer 110 may be removed, for example, by a wet etch process. The isolation layer 108 may be partially removed by a wet etch process to form partial isolation layer 116. As shown in FIG. 6, a height of the partial isolation layer 116 may be lower than a height of the active fin 118. In example embodiments, both sides of the active fin 118 may be exposed.

Figure 7:
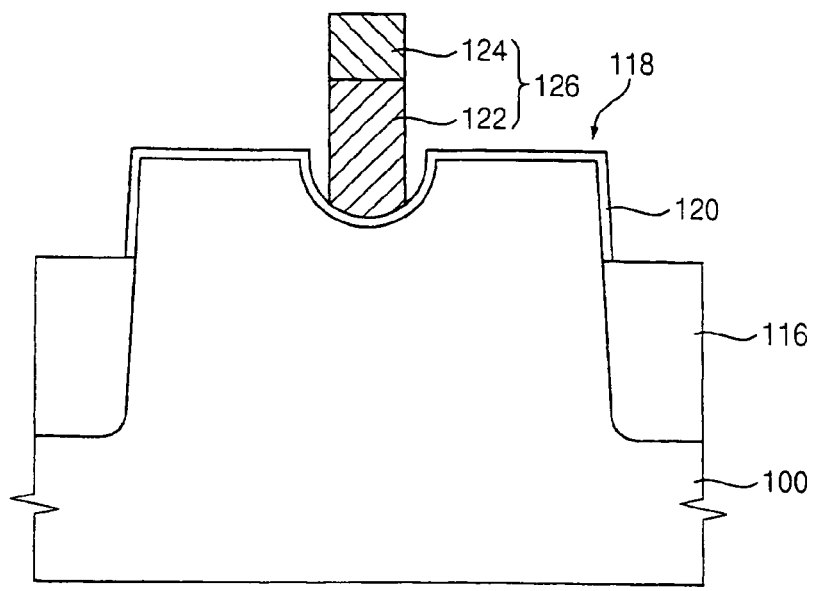

As illustrated in FIG. 7, the gate insulating layer 120 may be formed on the active fin 118. The gate insulating layer 120 may include an oxide layer, a nitride layer, an aluminum oxide layer, and/or a high dielectric layer. The gate structure 126 may be formed on an inner or upper surface of the curved or rounded trench 114 between the source and drain regions. The gate structure 126, which may include the gate electrode 122 and the gate mask layer 124, may be formed on the gate insulating layer 120 by a CVD, photo and etch process.

Figure 8:
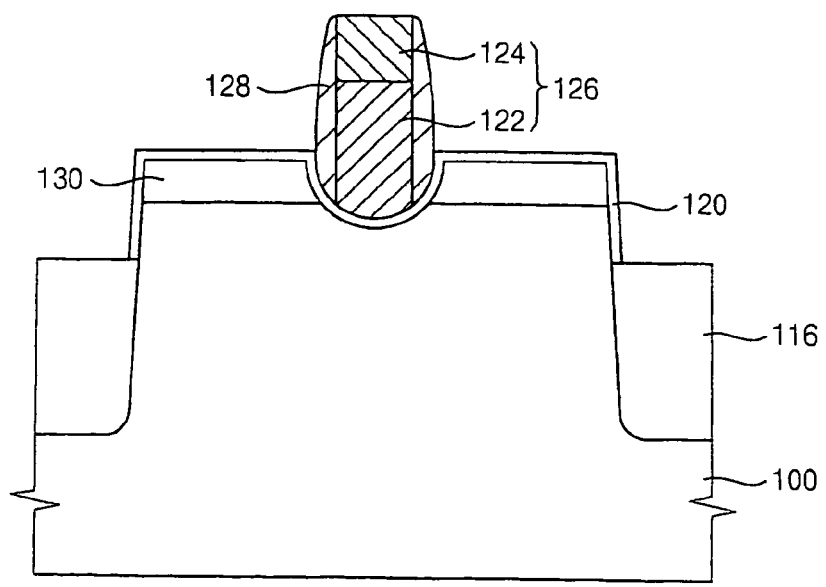

As illustrated in FIG. 8, a gate spacer 128 may be formed on the sides of the gate structure 126 and in the curved or rounded trench 114 by a CVD and etch back process. Source and drain regions 130 may be formed by a self-aligned ion implantation process (IIP) using the gate structure 126.

As illustrated in FIGS. 2A and 8, the gate structure 126 may be substantially perpendicular to the active fin 118 and may overlap the active fin 118 in the center area between the source and drain 130.

As shown in FIG. 8, an upper surface U1 of the source and drain regions 130 may be higher than a bottom surface B1 of the gate electrode 122, therefore, off current may be reduced. In example embodiments, an overlap region, between the gate electrode 122 and the source and drain regions 130 may be reduced, therefore, gate induced drain leakage (GIDL) may also be reduced.

As illustrated in FIG. 8, the bottom surface B1 of the gate electrode 122 may be higher than an upper surface of the isolation layer 116.

Figure 9:
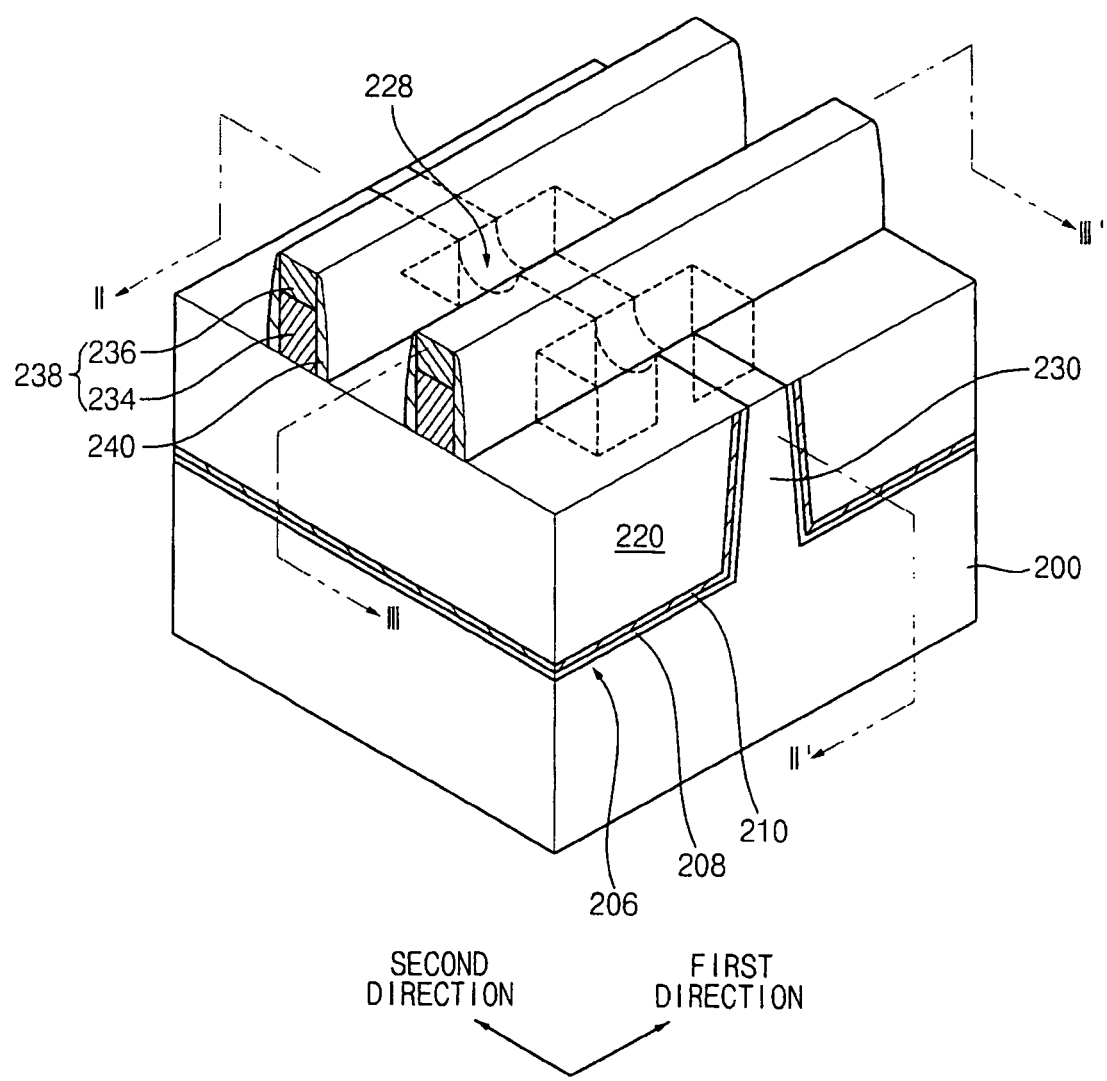
FIG. 9 illustrates an FET in accordance with example embodiments.

FIG. 9 illustrates an FET in accordance with example embodiments. As illustrated in FIG. 9, an FET may include a substrate 200, a first trench 206, a first oxide layer 208, a liner nitride 210, an isolation layer 220, a second trench 228, an active fin 230, a gate structure 238, a hard mask 236, and/or a gate electrode 234. As illustrated in FIG. 9, an elevated source/drain FinFET structure may be formed on an active fin 230 and isolation layer 220.

The active fin 230 may be formed on the substrate 200. The isolation layer 220 may be formed in a first trench 206 on both sides of the active fin 230. The active fin 230 height may be higher than the height of the isolation layer 220. Therefore, both sides of the active fin 230 may be exposed. The active fin 230 may have a curved or rounded trench surface in the center area. The gate structure 238 may be formed on the curved or rounded second trench 228 and an isolation layer 220 and may have the appearance of a saddle. The curved or rounded trench surface may provide a longer effective length between the source and drain, therefore GIDL and/or off current may be reduced.

Example embodiments of FIG. 9 are similar to example embodiments shown in FIG. 2A, however in example embodiments in FIG. 9, the active fin 230 need not extend above the isolation layer 220.

As discussed above, any of the shapes and/or variations illustrated in FIGS. 2B-2E may also be applied to the example embodiments of FIG. 9.

Figure 10:
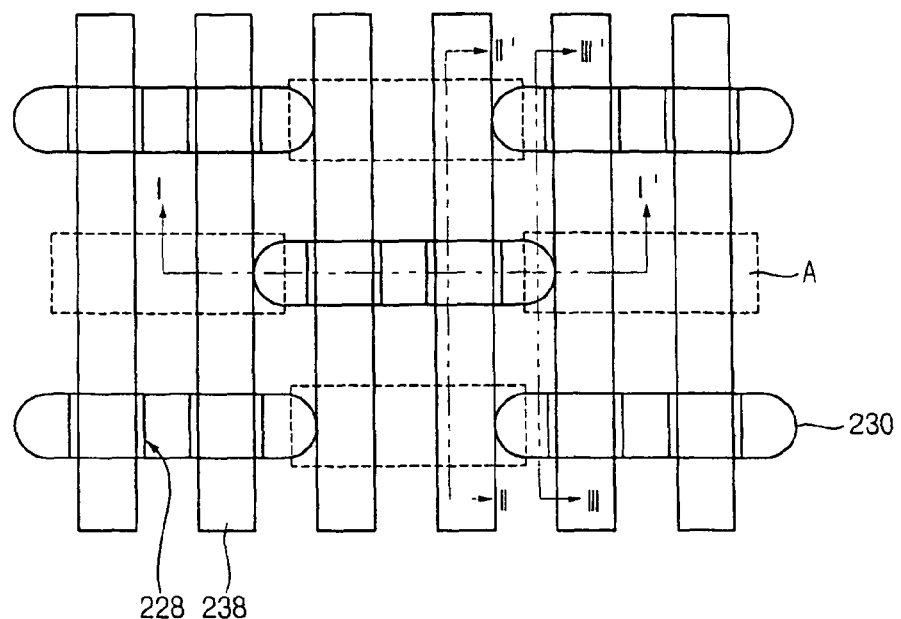
FIG. 10 illustrates a layout of an FET in accordance with an example embodiment.

FIG. 10 illustrates a layout of an FET in accordance with an example embodiment. FIG. 10 illustrates an example relationship between the second trench 228, the active fin 230, and the gate structure 238. As shown, the second trench 228 may be under the gate structure 238 and slightly wider than the gate structure 238. The active fins 230 and the gate structures 238 may be substantially perpendicular to one another.

FIGS. 11-20 illustrated an example method of manufacturing the example FinFET of FIG. 9. FIGS. 11A, 12A, 13A, 14A, 15A, 16A, and 17A illustrate the example FinFET of FIG. 9 along line I-I'. FIGS. 11B, 12B, 13B, 14B, 15B, 16B, and 17B illustrate the example FinFET of FIG. 9 along line FIGS. 11C, 12C, 13C, 14C, 15C, 16C, and 17C illustrate the example FinFET of FIG. 9 along line III-III'.

Figure 11A:
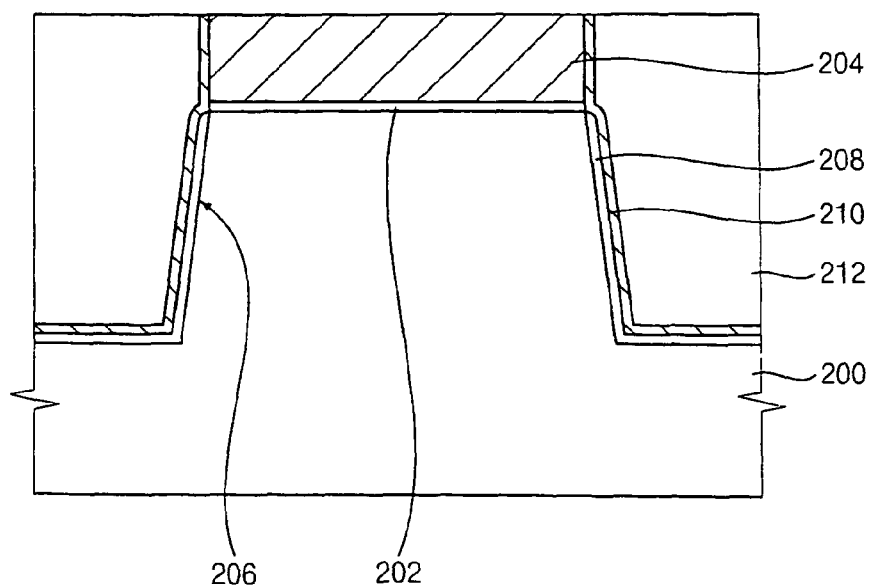
FIGS. 11A-20 illustrate an example method of manufacturing the example FinFET of FIG. 9.
Figure 11B:
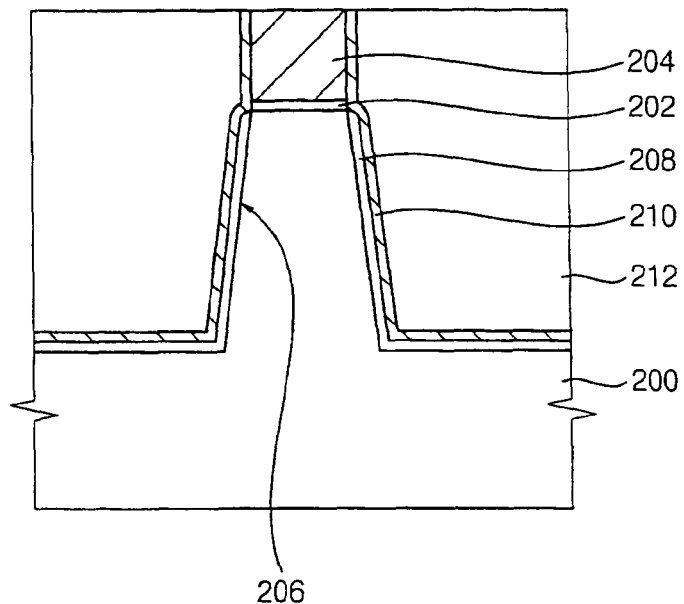
Figure 11C:
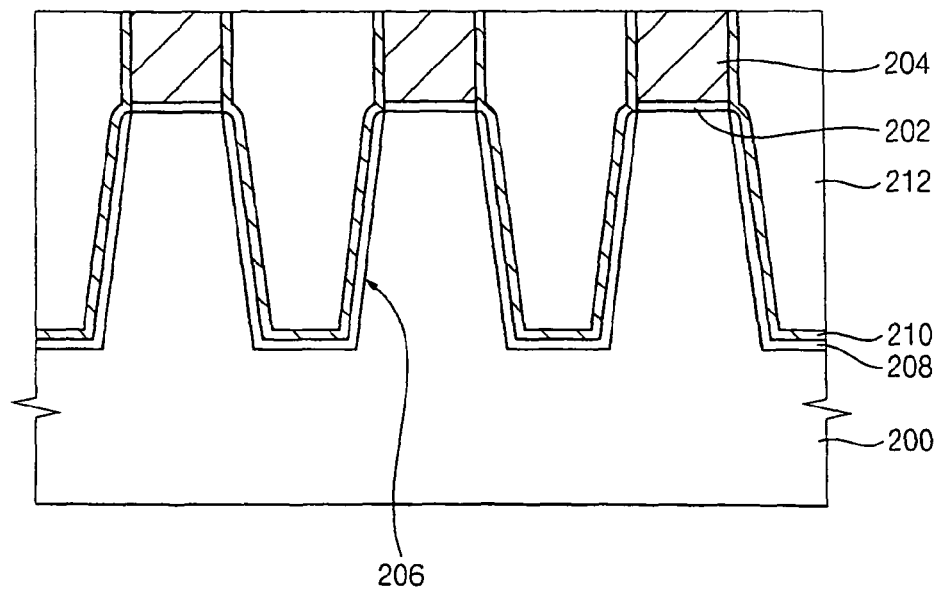

As illustrated in FIGS. 11A-11C, a pad oxide 202 may be formed on the substrate 200. A first hard mask layer 204 may be formed on a pad oxide 202 by a CVD process, as discussed above. An isolation layer 212 may be formed by an STI process, as discussed above. A first oxide layer 206 and a liner nitride layer 208 may be formed in a first trench.

Figure 12A:
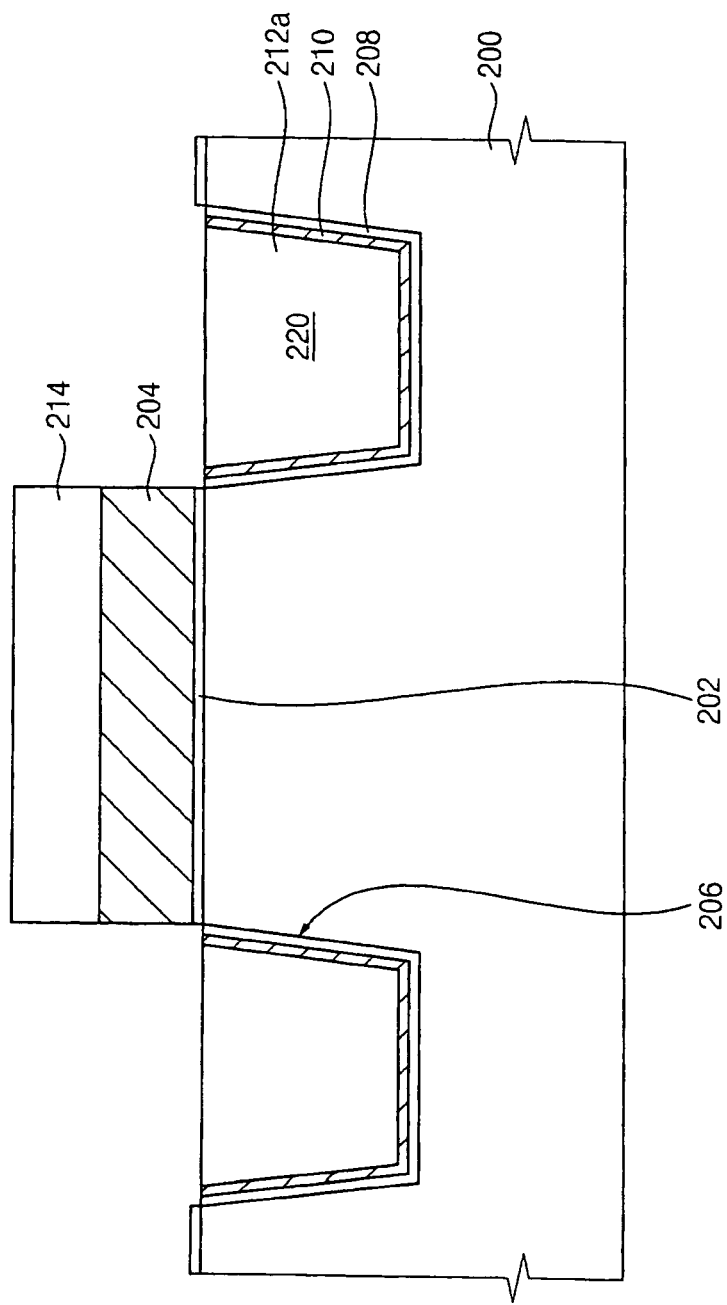
Figure 12B:
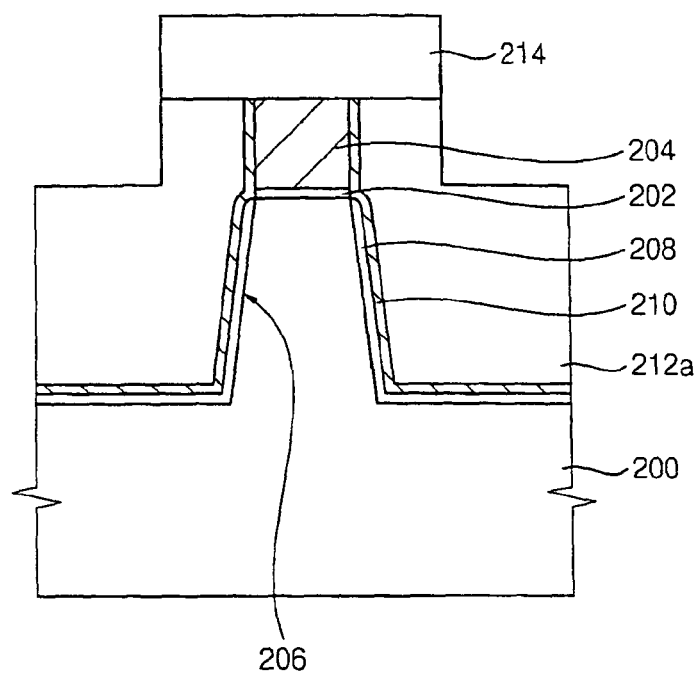
Figure 12C:
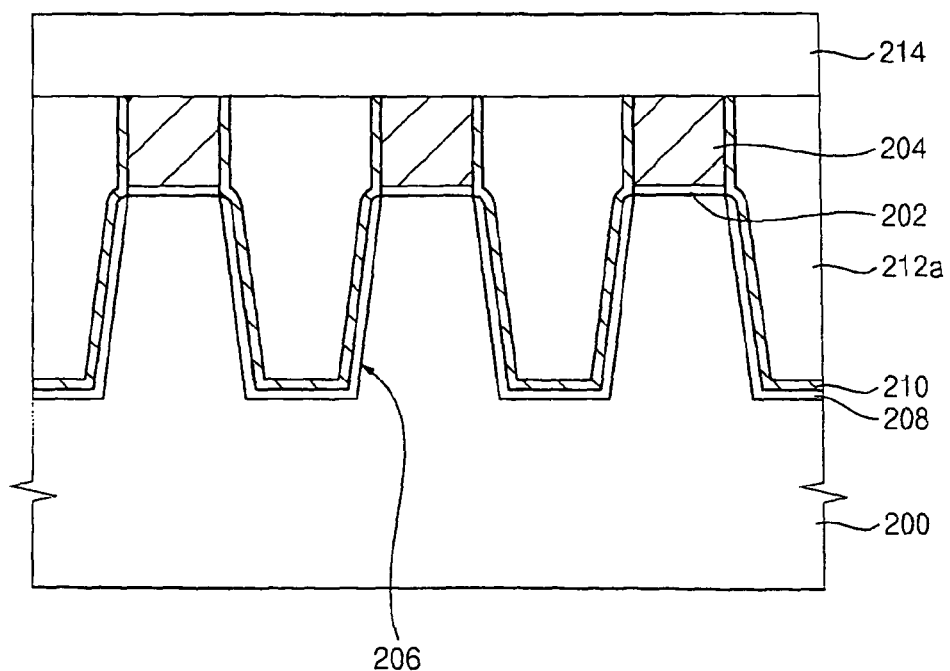

A photoresist 214 pattern may be formed on a first hard mask layer 204 as shown in FIG. 12A. The photoresist pattern 214 may also be formed on the first hard mask layer 204 and partially on the isolation layer 212A, as shown in FIG. 12B. The photoresist pattern 214 may also be formed on the first hard mask layer 204 and the isolation layer 212A as shown in FIG. 12C.

Figure 13A:
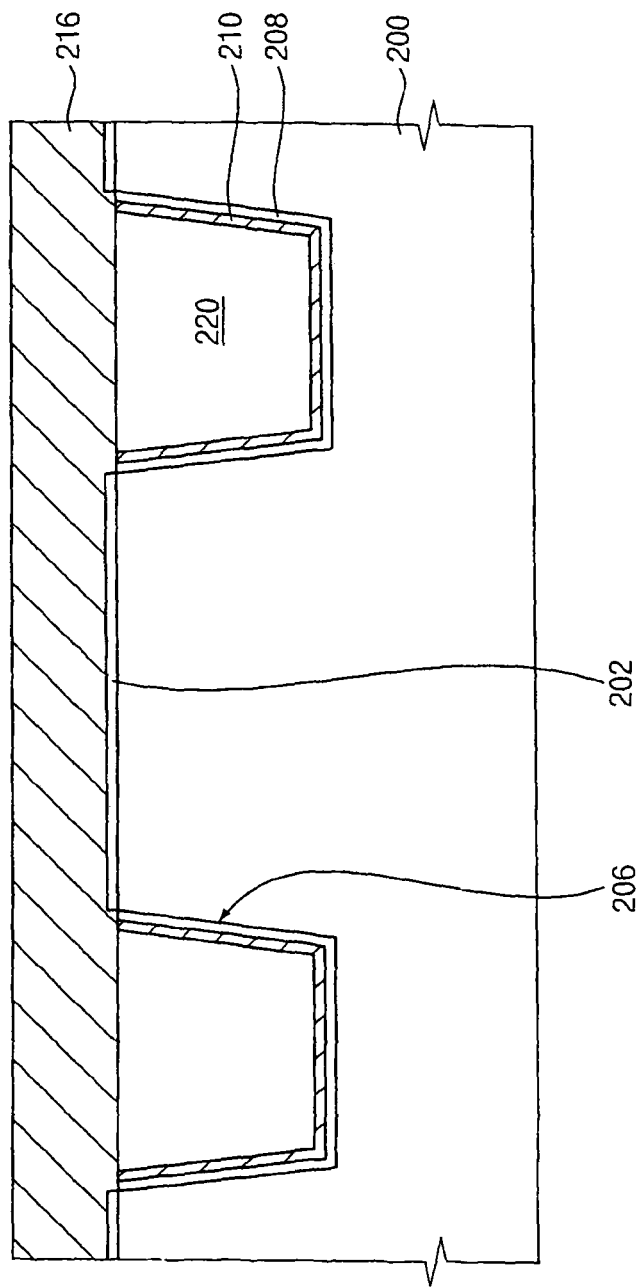
Figure 13B:
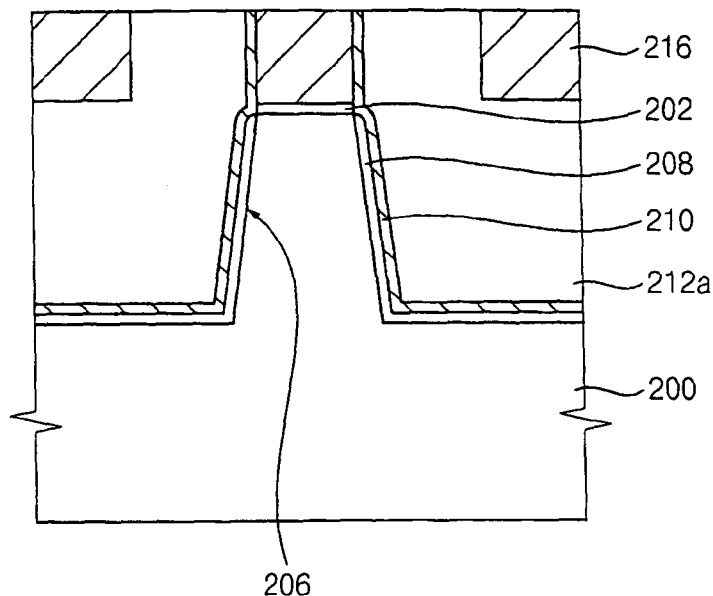
Figure 13C:
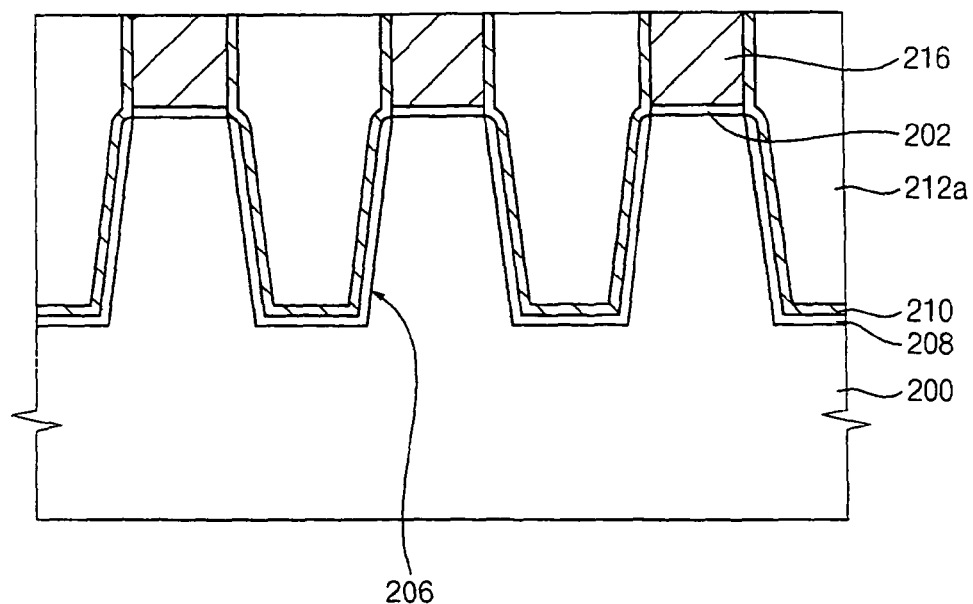

As illustrated in FIG. 13A-13C, the first hard mask 204 and the photoresist pattern 214 may be removed and a second hard mask layer 216 may be formed on the active fin and isolation layer by a CVD process.

Figure 14A:
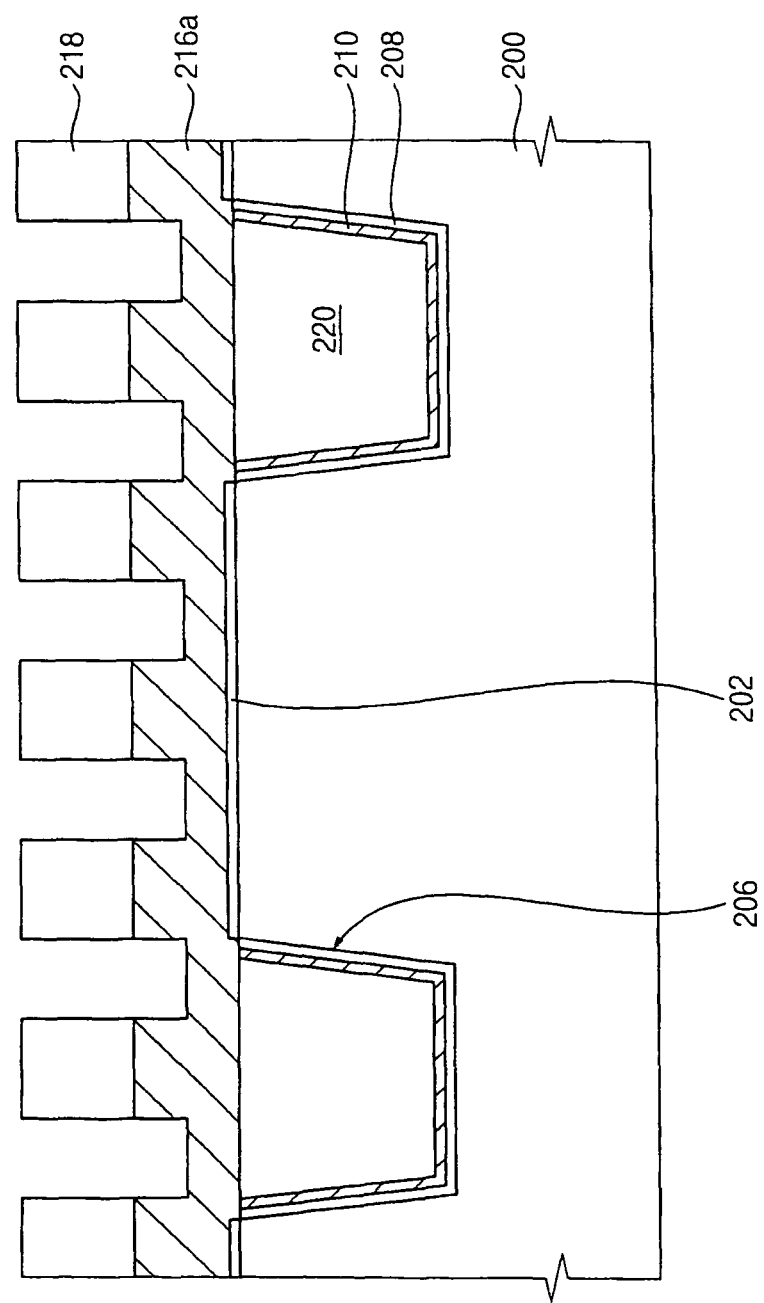
Figure 14B:
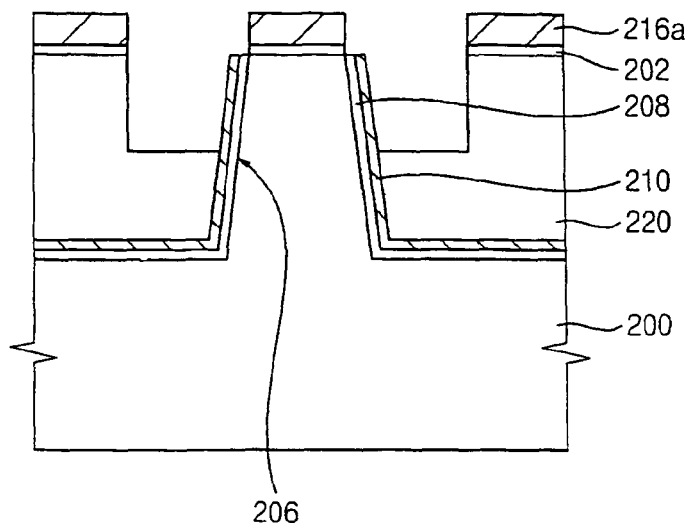
Figure 14C:
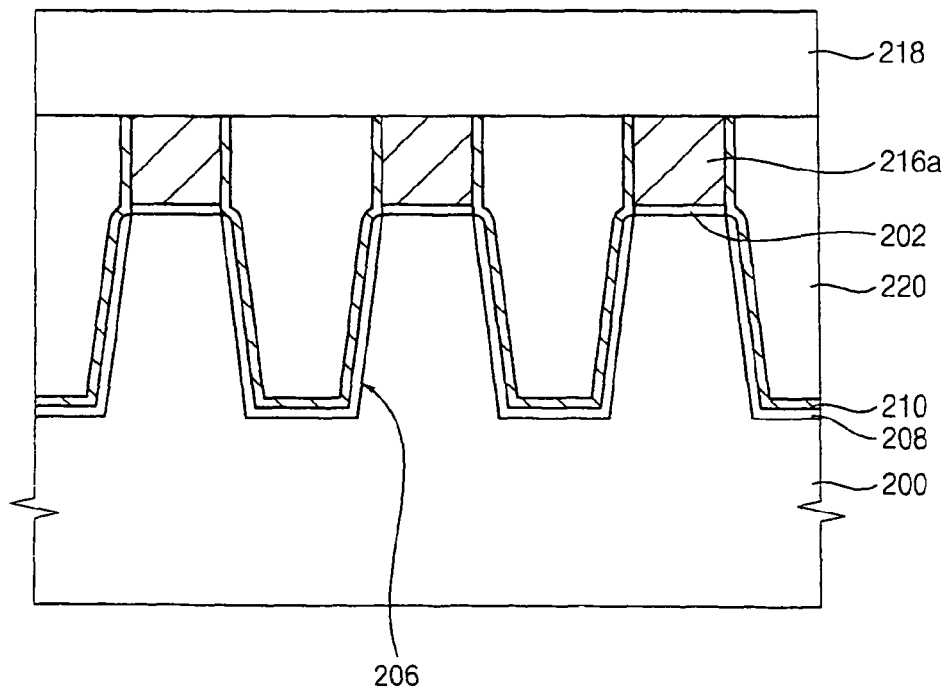

A second trench pattern may be formed in the second hard mask layer 216 by a photo and etch process, as illustrated in FIG. 14A. The isolation layer 120 may be partially etched, as shown in FIG. 14B.

Figure 15A:
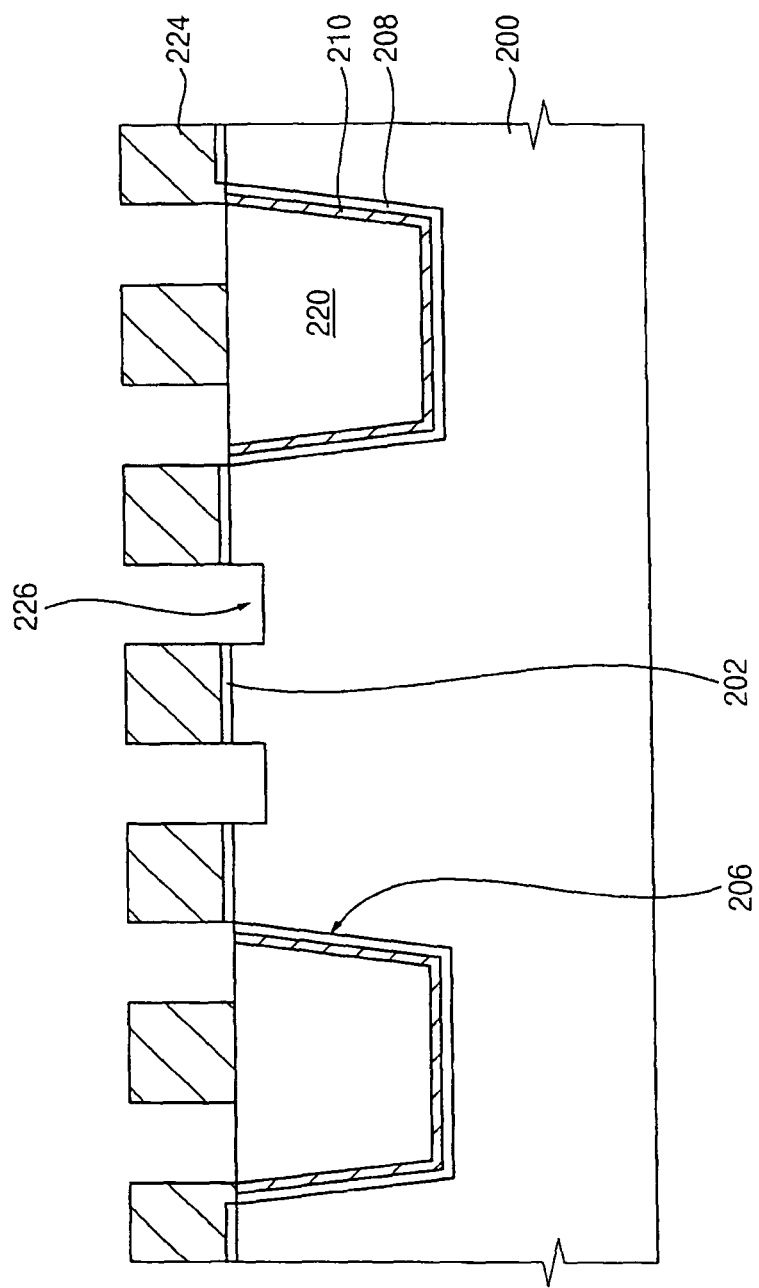
Figure 15B:
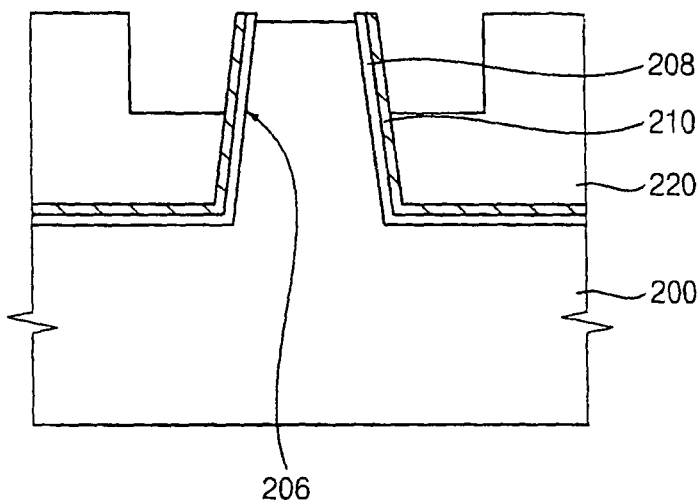
Figure 15C:
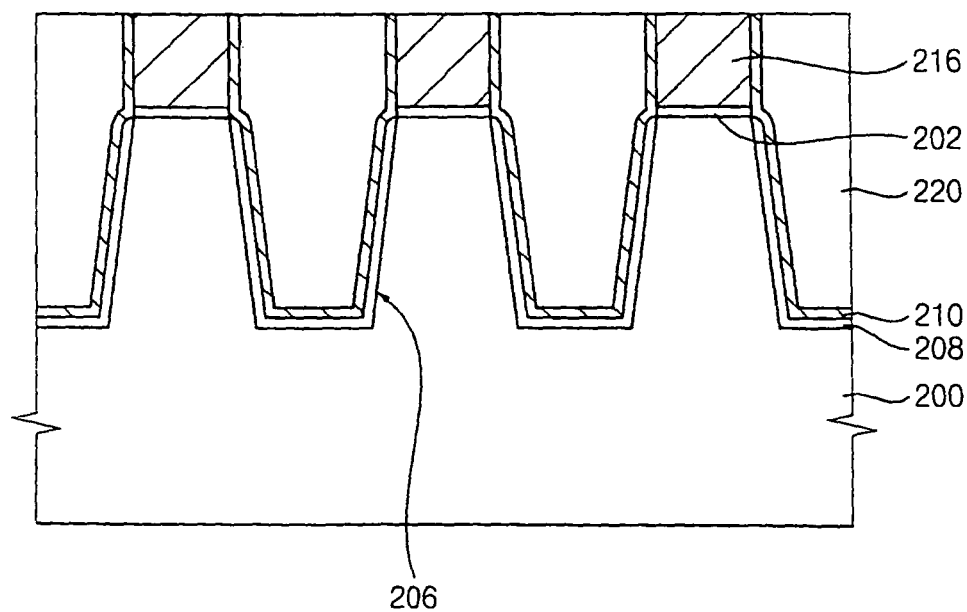

As illustrated in FIGS. 15A-15C, the second photoresistor may be removed and the second trench 228 may be formed on the active fin.

Figure 16A:
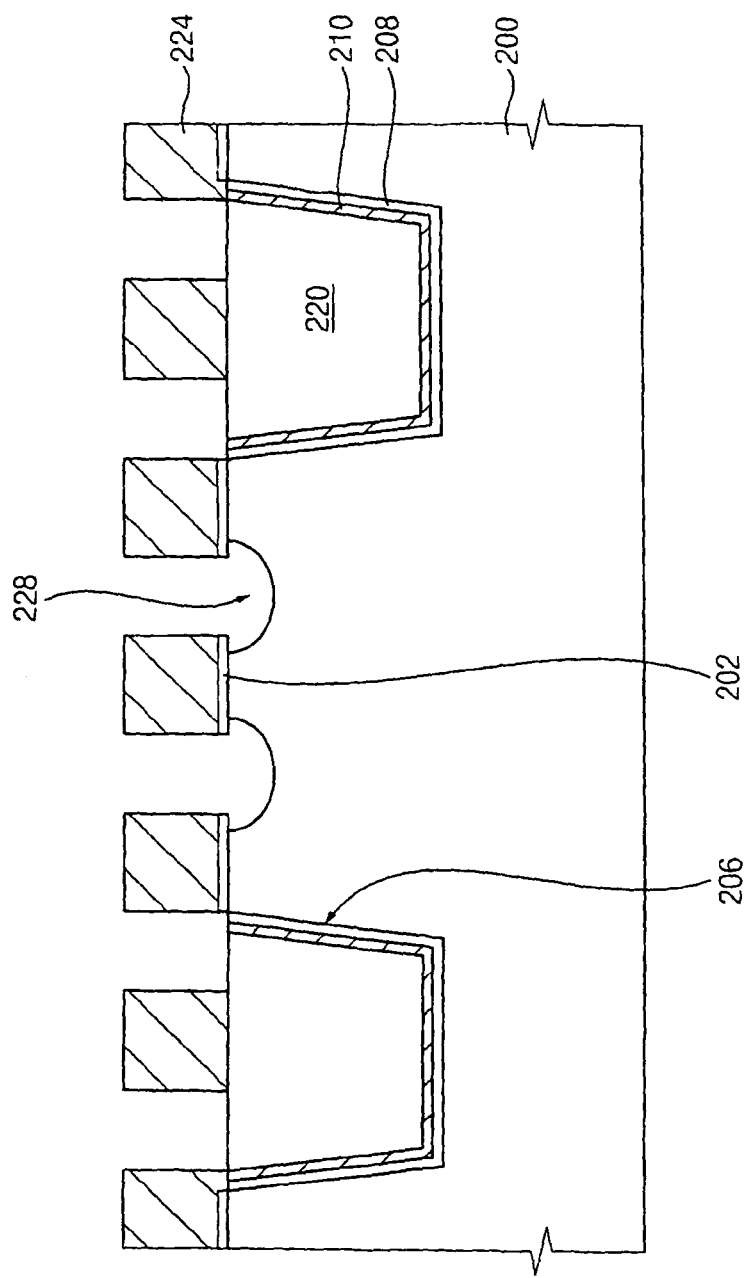
Figure 16B:
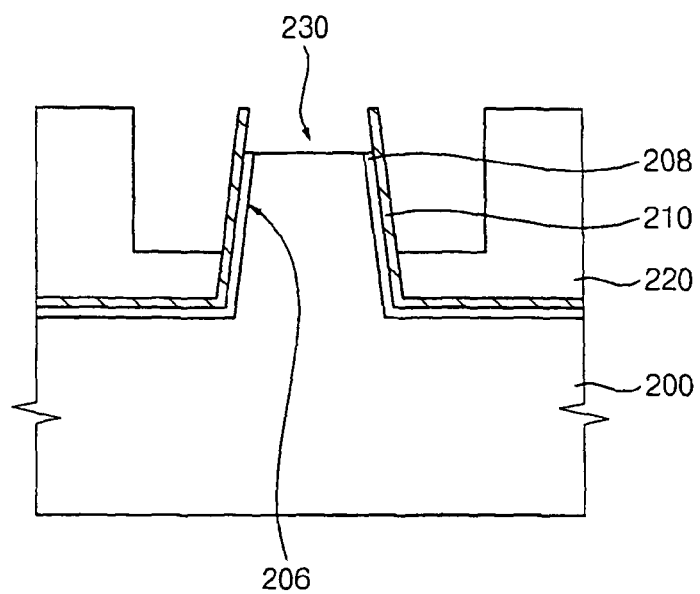
Figure 16C:
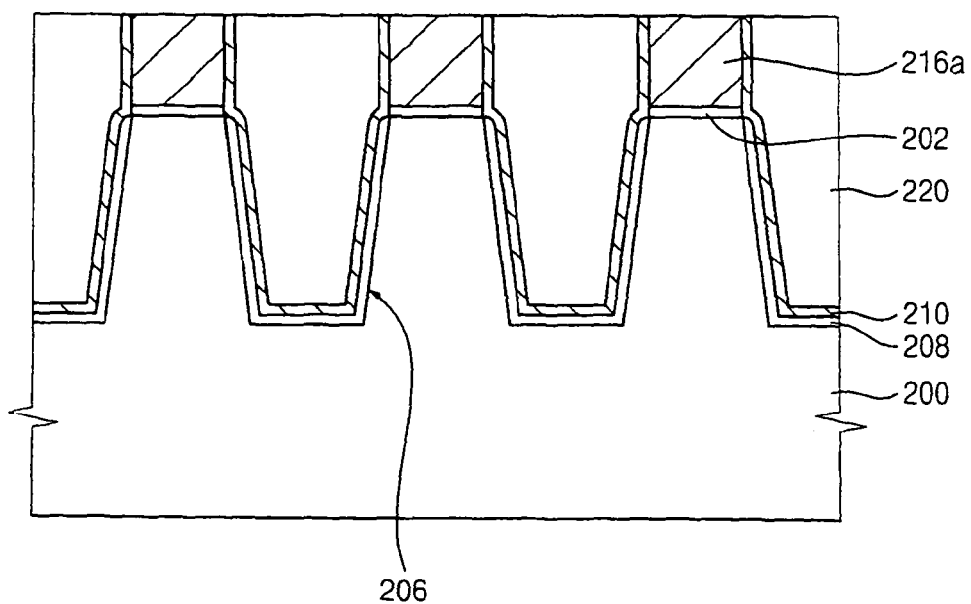

As illustrated in FIGS. 16A-16C, the second trench may be rounded by a wet etch process.

Figure 17A:
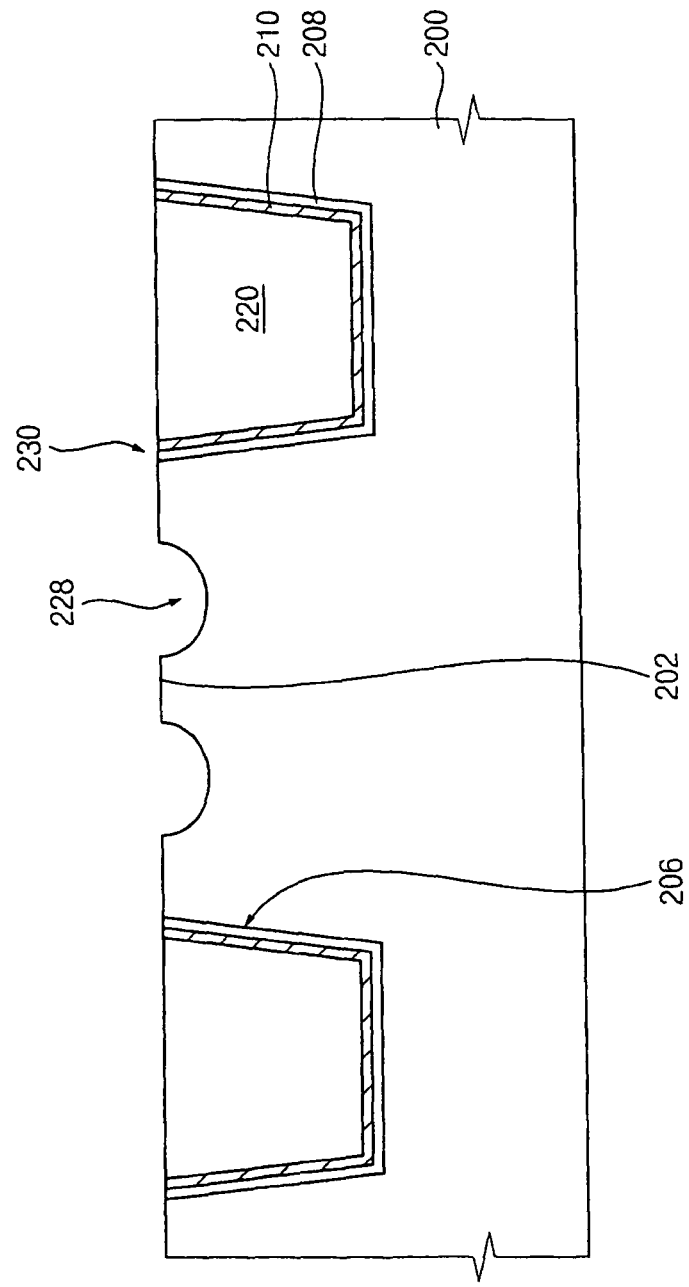
Figure 17B:
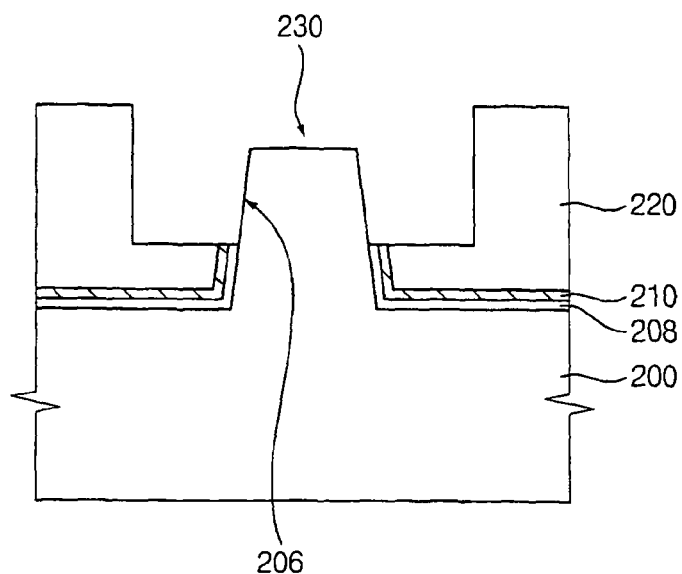
Figure 17C:
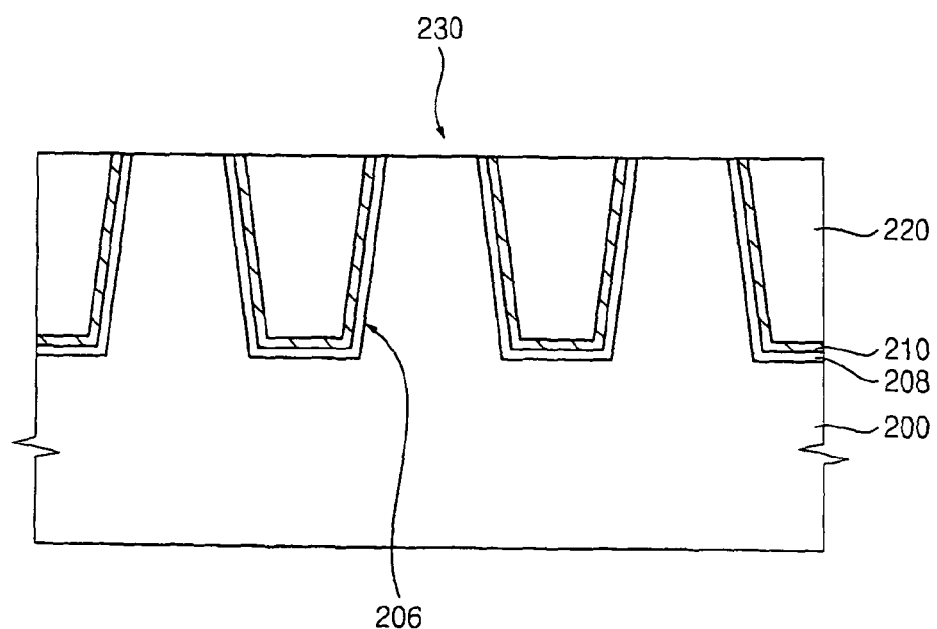

As illustrated in FIGS. 17A-17C, the pad oxide and the first hard mask layer may be removed by wet etching and the pad oxide layer 208 and the liner nitride 210 may be partially removed by wet etching as illustrated in FIG. 16B.

Figure 18A:
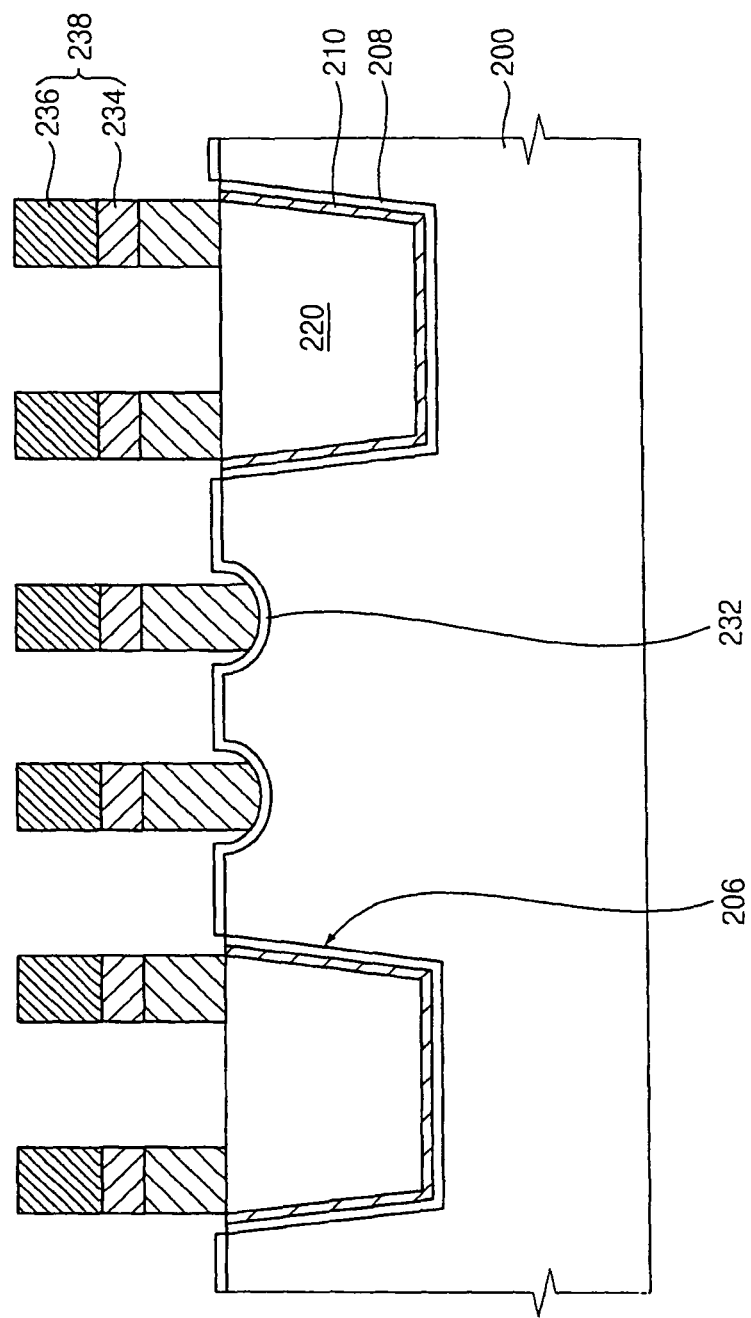
Figure 18B:
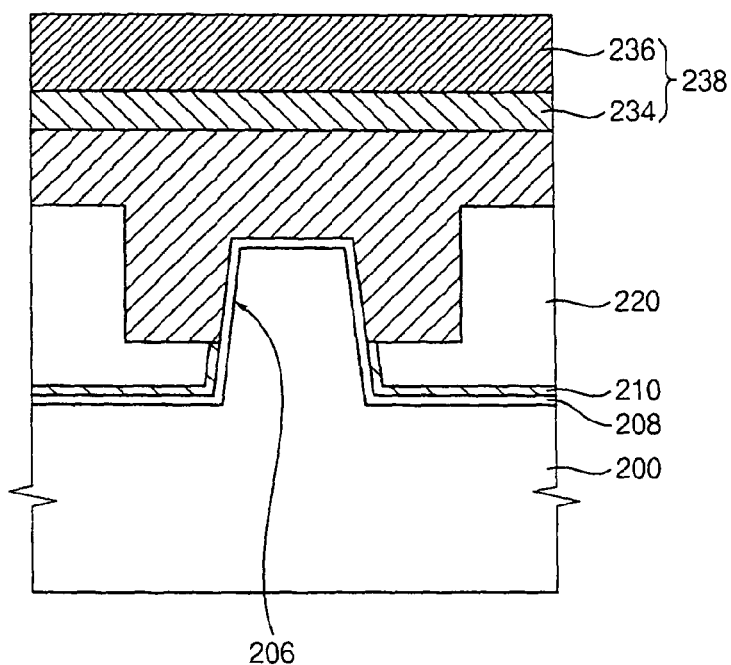
Figure 18C:
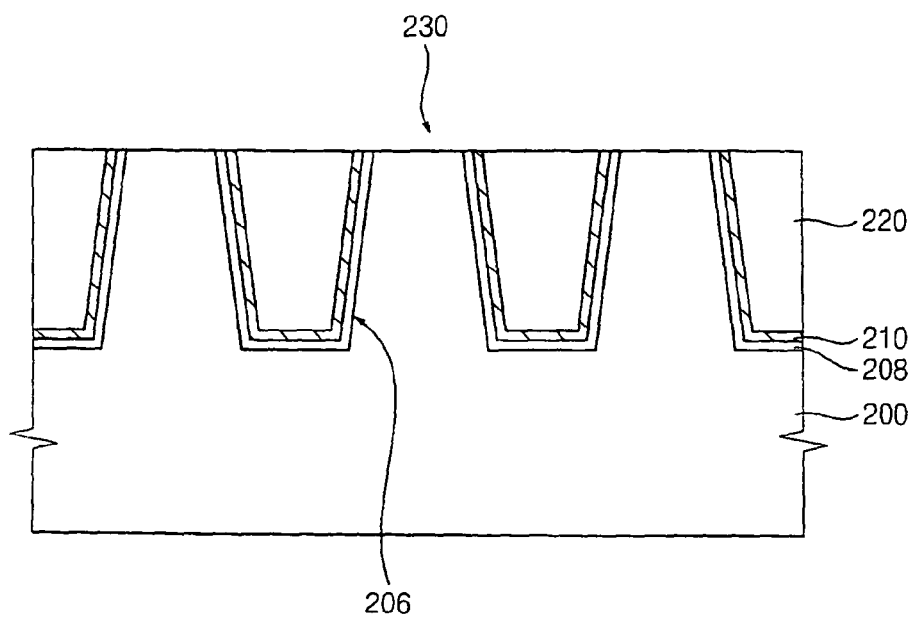

As illustrated in FIGS. 18A-18C, a gate insulation layer 232 may be formed in the active fin 230. The gate insulating layer 232 may include an oxide layer, a nitride layer, an aluminum oxide layer, and/or a high dielectric layer. A gate structure 238 may be formed on an inner portion of the second round trench between the source and drain regions. A gate electrode 234 and gate mask layer 236 may be formed on the gate insulating layer 232 by a CVD, a photo and etch process. A gate structure 238 may be formed on the second trench.

Figure 19:
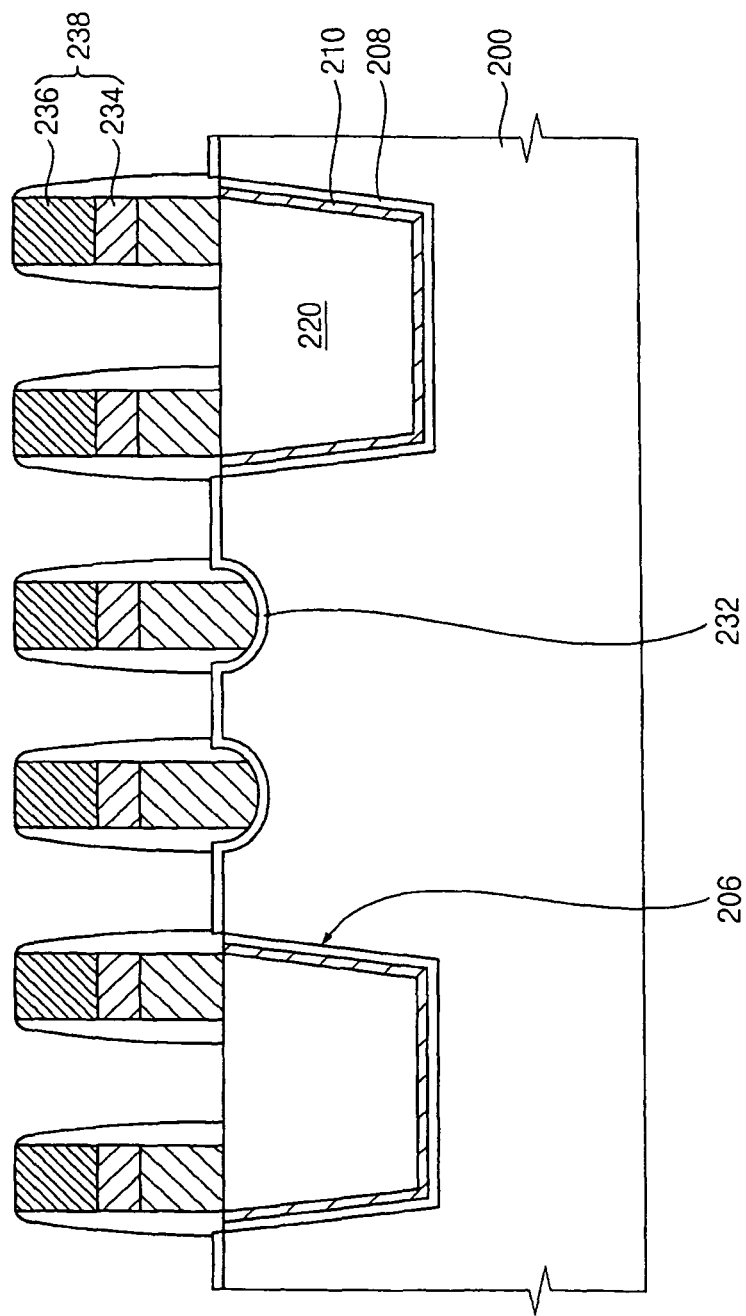

As illustrated in FIG. 19, a gate spacer may be formed on the gate structure and the source and drain may be formed by an IIP process.

Figure 20:
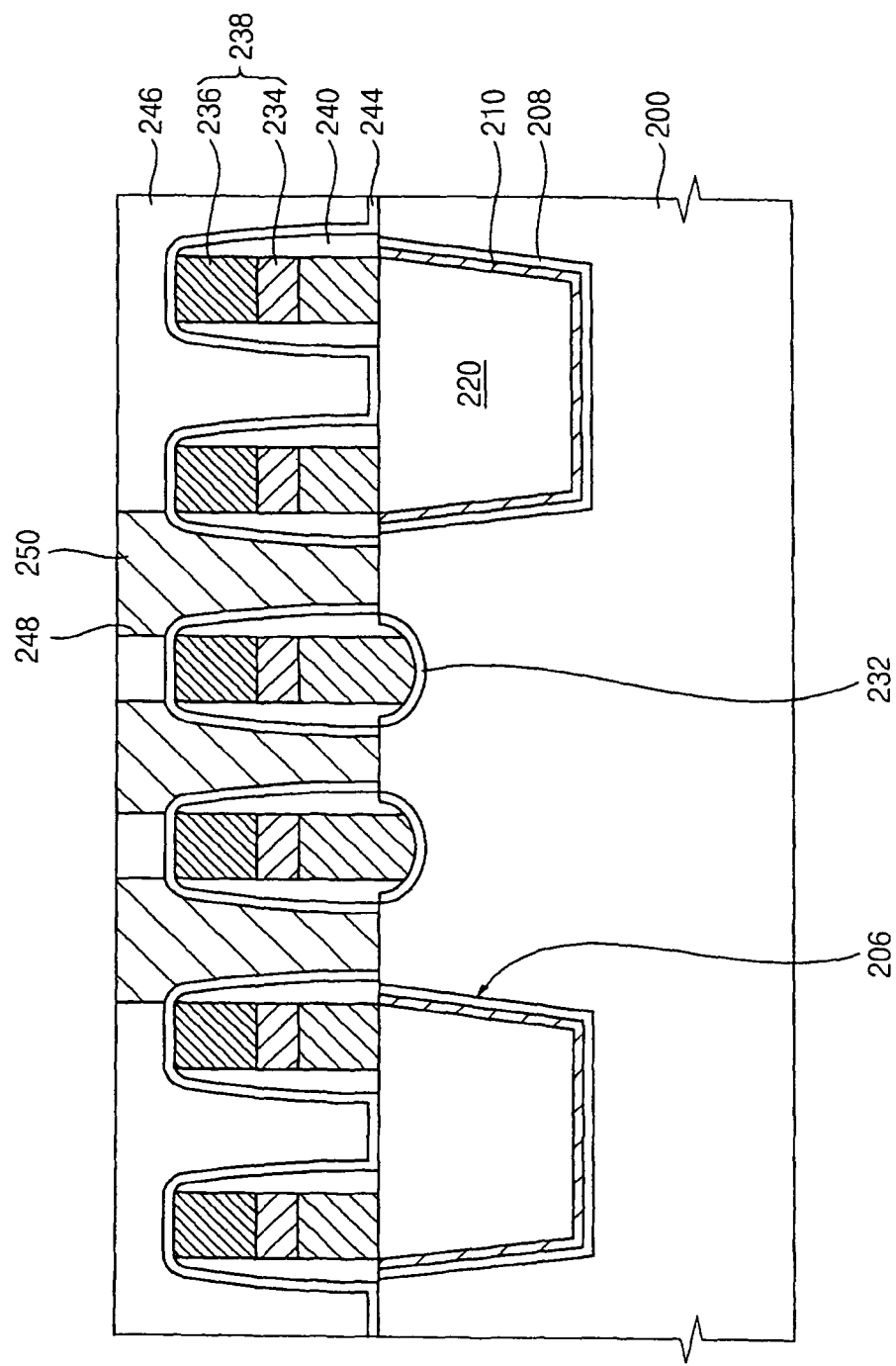

As illustrated in FIG. 20, an inner layer dielectric 246 may be formed on the substrate and gate structure. A contact hole 248 may be formed by a self-aligned contact (SAC) process and a bit line node 250 may be formed in the contact hole.

In example embodiments, as illustrated in FIG. 9, an elevated source/drain FinFET structure may be formed on the active fin 230 and isolation layer 220. The active fin 230 may be formed on the substrate. The isolation layer 220 may be formed in a first trench 206 on both sides of the active fin 230. The active fin 230 may have a curved or rounded trench surface in a center portion thereof. A gate structure 238 may be formed on the rounded second trench 228 and the isolation layer 220, in the form of a saddle. The rounded trench surface may provide a longer effective length between the source and drain, therefore, GIDL and/or off current may be decreased.

Figure 21:
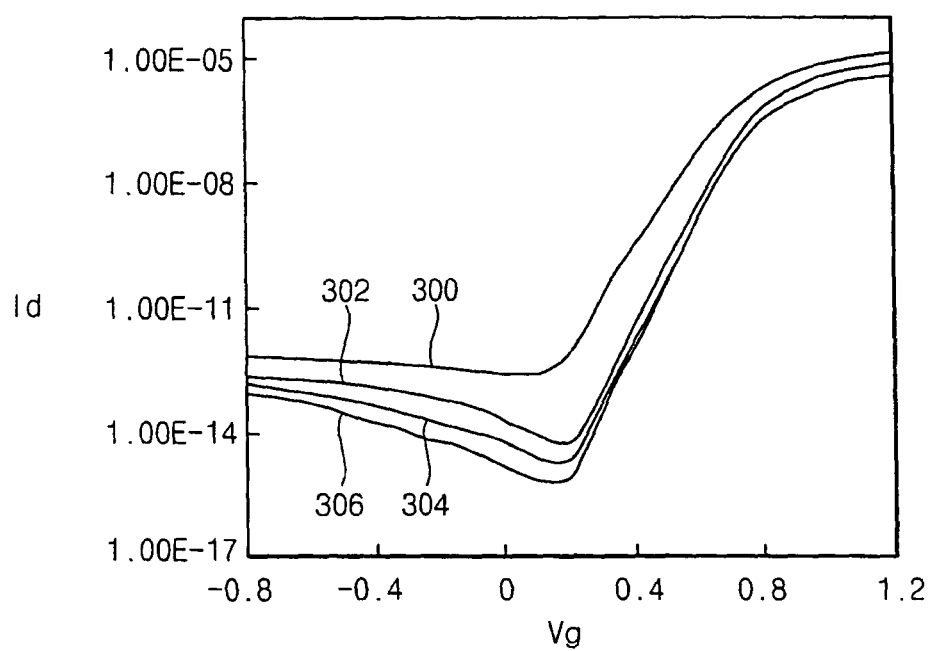
FIG. 21 illustrates a comparison of off currents as a function of voltages for a non-elevated FinFET and several FinFETs of varying elevations.

FIG. 21 illustrates a comparison of off currents as a function of voltages for a non-elevated FinFET and several FinFETs of varying elevations. Reference number 300 illustrates the off current versus voltage for a conventional finFET. Reference numbers 302, 304, and 306 illustrate source/drain pairs elevated with respect to the gate structure by 200 Å, 300 Å, and 500 Å, respectively. As shown in FIG. 21, the higher the source/drain pair is elevated with respect to the gate structure, the lower the off current.

Although example embodiments have been described above, these example embodiments may be varied and/or augmented in many ways. For example, although example embodiments as illustrated in FIGS. 2A and 9 above have both of elevated source and drain, either the source or drain may be elevated.

Further, example embodiments, as described above, may be implemented in any number of field effect transistors, for example, metal-oxide-semiconductor FETs (MOSFETs), junction FETs (JFETs), metal semiconductor FETs (MESFETs), heterostructure FETs (HFETs), and/or modulation-doped FETs (MODFETs).

Example embodiments, as described above, may also be used in many types of non-volatile semiconductor memory, for example, floating gate non-volatile memory, nitride non-volatile memory, ferroelectric memories, magnetic memories, and/or phase change memories.

Example embodiments, as described above, may include any type of charge storing device, for example, a floating gate storage charge storage device, a charge trap layer storage device, and/or a nanocrystalline charge storing device.

Example embodiments, as described above, may also be used in many types of memory cells, for example, a metal-oxide-insulator-oxide-semiconductor (MOIOS), for example, a silicon-oxide-nitride-oxide-semiconductor (SONOS), a metal-oxide-nitride-oxide-semiconductor (MONOS), or a tantalum-aluminum oxide-nitride-oxide-semiconductor (TANOS). As set forth above, a SONOS structure may use silicon as the control gate material, a MONOS structure may use a metal as the control gate material, and a TANOS structure may use tantalum as the control gate material.

An MOIOS memory device may also use a charge trap layer, for example, silicon-nitride ($Si_3N_4$) instead of a floating gate as a charge storing device. The MOIOS memory device may have another structure in which nitride and oxide may be sequentially stacked instead of a stacked structure formed of a floating gate and insulating layer stacked on the upper and lower portions between the substrate and the control gate as in the memory cell of a flash semiconductor device. The MOIOS memory device may use the shifting characteristic of the threshold voltage as charges may be trapped in the insulator or nitride layer.

Although example embodiments illustrated in FIG. 2A include one gate structure and example embodiments illustrated in FIG. 9 include two gate structures, any number of gate structures may be provided, as needed.

Example embodiments, as described above, may be implemented in flash memory, for example, NOT-OR (NOR) type and NOT-AND (NAND) flash memory. Example embodiments, as set forth above, may be arranged in a circuit array, for example, in an array of NOR or NAND strings.

Example embodiments, as described above, may also be stacked on another similar arrangement, separated by an insulator, for example, a dielectric. The stack may be a vertical stack and may include two or more arrangements as illustrated in FIGS. 2A and/or 9.

Example embodiments, as described above, may also be implemented in charge storage devices which store a single bit of data or in a multi-level cell, where two or more bits may be stored.

Example embodiments, as described above, may be implemented in non-volatile memory used in various electronic products, for example, personal computers, personal digital assistants (PDAs), cellular phones, digital still cameras, digital video cameras, video game players, memory cards, and other electronic devices. Example embodiments as described above may also be implemented in non-volatile memory cards including multimedia cards (MMC), secure digital (SD) cards, compact flash cards, memory sticks, smart media cards, and extreme digital (xD) picture cards.

While example embodiments have been particularly shown and described with reference to the example embodiments shown in the drawings, it will be understood by those of ordinary skill in the art that various changes in form and detail may be made therein without departing from the spirit and scope of the following claims.

What is claimed is:

1. A method of forming a field effect transistor (FET), comprising:
   providing a substrate;
   forming an active fin including a source and drain, respectively, on the substrate and an isolation region adjacent to the active fin;

forming a recessed region in an area of the active fin between the source and drain; and forming a gate structure including a gate electrode and a gate spacer, substantially perpendicular to the active fin, in the recessed region in the area of the active fin, the gate spacer extending into the recessed region, wherein the method further includes, forming an insulating layer on the active fin to completely extend over the source and drain and the recessed region between the source and drain, wherein the insulating layer is between the gate spacer and at least one of the source or drain and wherein the recessed region is extended in a direction of the gate structure from a side of an edge of the active fin to an opposite side of the edge of the active fin.

2. The method of claim 1, wherein:
the isolation region includes an isolation layer,
a first portion of the upper surface of the isolation layer is substantially planar with an upper surface of the active fin, and
a second portion of the upper surface of the isolation layer adjacent to the active fin is lower than the upper surface of the active fin.

3. The method of claim 1, wherein the active fin and the isolation region are formed by shallow trench isolation (STI).

4. The method of claim 1, wherein forming the active fin further includes:
forming a pad oxide on the substrate,
forming a hard mask layer on the pad oxide by chemical vapor deposition (CVD);
forming an isolation layer in the isolation region; and
forming a trench in the area of the active fin.

5. The method of claim 4, wherein forming the recessed region in the area of the active fin further includes:
rounding a bottom surface of the trench by a wet etch process, and
etching away at least one of the pad oxide, the hard mask layer, or a portion of the isolation region.

6. The method of claim 5, wherein forming the gate structure further includes:
forming a gate electrode layer on the insulating layer,
forming a gate mask layer on the gate electrode layer,
depositing a photoresist on the gate mask layer;
patterning the photoresist to form a gate electrode and a gate mask on a bottom surface of the recessed region,
depositing a layer of the gate spacer on the insulating layer in the recessed region and the gate mask, and
patterning the gate spacer layer to form the gate spacer in the recessed region on sidewalls of the gate electrode and the gate mask in the recessed region to form the gate structure, wherein a width of the gate spacer is at least substantially equal to a width of the active fin.

7. The method of claim 6, wherein the gate electrode and the gate mask are formed by a CVD, photoresist and etch process.

8. The method of claim 6, wherein the insulating layer includes one of an oxide layer, a nitride layer, and a metal oxide layer.

9. The method of claim 6, wherein the gate spacer is formed by a CVD, photoresist and etch process.

10. The method of claim 6, wherein the source and drain of the active fin are formed by a self-aligned ion implantation process using the gate structure.

11. The method of claim 1, wherein:
a bottom portion of the gate spacer has a first width, and
a top portion of the gate spacer has a second width less than the first width.

12. The method of claim 1, wherein forming the insulating layer includes
forming the insulating layer between the gate spacer and at least one of the source or drain.

13. The method of claim 12, wherein:
the gate spacer is on at least one sidewall of the recessed region, and
the insulating layer is between the gate spacer and at least one sidewall of the recessed region.

14. The method of claim 1, wherein a bottom surface of the recessed region has a substantially concave V-shape.

15. The method of claim 1, wherein a bottom surface of the recessed region has a substantially convex shape.

16. A method of forming a field effect transistor (FET), comprising:
providing a substrate;
depositing a pad oxide on the substrate;
depositing a hard mask layer on the pad oxide by chemical vapor deposition;
forming an active fin and isolation layer by shallow trench isolation;
forming a first trench in a center area of the active fin;
rounding a bottom surface of the first trench to form a recessed region in the active fin;
depositing a gate insulating layer on at least an upper surface of the active fin;
forming a gate structure on the bottom surface of the recessed region;
forming gate spacers on sidewalls of the gate structure in the recessed region, the gate spacers extending into the recessed region;
forming a source and drain, at an upper portion of the active fin, elevated with respect to the gate structure, wherein the recessed region is extended in a direction of the gate structure from a side of an edge of the active fin to an opposite side of the edge of the active fin, and
wherein forming the gate insulating layer includes forming the gate insulating layer to completely extend over the source and drain and the recessed region between the source and drain and wherein the insulating layer is between the gate spacers and respective ones of the source and drain.

17. The method of claim 16, further comprising:
removing an upper portion of the isolation layer adjacent to the active fin, such that an upper surface of the active fin is substantially planar with an upper surface of the isolation layer and a first portion of the upper surface of the isolation layer is substantially planar with the upper surface of the active fin and a second portion of the upper surface of the isolation layer adjacent to the active fin is lower than the upper surface of the active fin.

18. A method of forming a field effect transistor (FET), comprising:
providing a substrate;
forming an active fin including a source and drain, respectively, on the substrate and an isolation region adjacent to the active fin;
forming a recessed region in an area of the active fin between the source and drain; and
forming a gate structure including a gate electrode and a gate spacer, substantially perpendicular to the active fin, in the recessed region in the area of the active fin, the gate spacer extending into the recessed region, wherein the method further includes,
forming an insulating layer on the active fin to extend over the source and drain and the recessed region between the source and drain, wherein the insulating layer is between the gate spacer and at least one of the source or drain and wherein the recessed region is extended in a direction of the gate structure from a side of an edge of the active fin to an opposite side of the edge of the active fin, wherein the gate spacer does not overlap upper surfaces of the source and drain.

* * * * *